(12) United States Patent
Kim et al.

(10) Patent No.: US 11,729,963 B2
(45) Date of Patent: Aug. 15, 2023

(54) SEMICONDUCTOR DEVICES

(71) Applicant: SAMSUNG ELECTRONICS CO., LTD., Suwon-si (KR)

(72) Inventors: Hyokyoung Kim, Hwaseong-si (KR); Jamin Koo, Hwaseong-si (KR); Jonghyeok Kim, Hwaseong-si (KR); Daeyoung Moon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 71 days.

(21) Appl. No.: 17/331,725

(22) Filed: May 27, 2021

(65) Prior Publication Data

US 2022/0115377 A1 Apr. 14, 2022

(30) Foreign Application Priority Data

Oct. 14, 2020 (KR) .................. 10-2020-0132672

(51) Int. Cl.
*H01L 27/108* (2006.01)
*H10B 12/00* (2023.01)
*H01L 29/423* (2006.01)

(52) U.S. Cl.
CPC ......... *H10B 12/30* (2023.02); *H01L 29/4236* (2013.01)

(58) Field of Classification Search
CPC ........... H01L 27/10805; H01L 29/4236; H01L 27/10814; H01L 27/10823; H01L 27/1085; H01L 27/10876; H01L 27/10885; H01L 27/10855
See application file for complete search history.

(56) References Cited

U.S. PATENT DOCUMENTS

| 7,659,213 | B2 | 2/2010 | Wei et al. |
| 8,580,678 | B2 | 11/2013 | Hwang |
| 8,581,405 | B2 | 11/2013 | Dertinger et al. |
| 8,648,423 | B2 | 2/2014 | Han et al. |
| 9,236,501 | B2 | 1/2016 | Lim |

(Continued)

FOREIGN PATENT DOCUMENTS

| CN | 105719998 A | 6/2016 |
| CN | 108987397 A | 12/2018 |
| TW | 201405640 A | 2/2014 |

OTHER PUBLICATIONS

Taiwanese Office action with Search Report dated Apr. 29, 2022 for corresponding TW Patent Application No. 110120942.

*Primary Examiner* — Mohammed R Alam
(74) *Attorney, Agent, or Firm* — Lee IP Law, P.C.

(57) ABSTRACT

A semiconductor device includes a substrate including an isolation layer pattern and an active pattern, a buffer insulation layer pattern on the substrate, a polysilicon structure on the active pattern and the buffer insulation layer pattern, the polysilicon structure contacting a portion of the active pattern, and the polysilicon structure extending in a direction parallel to an upper surface of the substrate, a first diffusion barrier layer pattern on an upper surface of the polysilicon structure, the first diffusion barrier layer pattern including polysilicon doped with at least carbon, a second diffusion barrier layer pattern on the first diffusion barrier layer pattern, the second diffusion barrier layer pattern including at least a metal, and a first metal pattern and a first capping layer pattern stacked on the second diffusion barrier layer pattern.

17 Claims, 22 Drawing Sheets

(56) References Cited

U.S. PATENT DOCUMENTS

| | | |
|---|---|---|
| 9,318,570 B2 | 4/2016 | Han et al. |
| 9,379,004 B1 | 6/2016 | Kwon et al. |
| 9,608,077 B1 | 3/2017 | Kye et al. |
| 10,373,961 B2 | 8/2019 | Yoon et al. |
| 10,672,773 B2 | 6/2020 | Ji et al. |
| 2012/0001267 A1* | 1/2012 | Lee ................ H01L 21/823842 257/E27.06 |
| 2014/0264953 A1 | 9/2014 | Lim et al. |
| 2020/0111673 A1* | 4/2020 | Yang .................. H01L 21/3086 |

* cited by examiner

FIG. 4
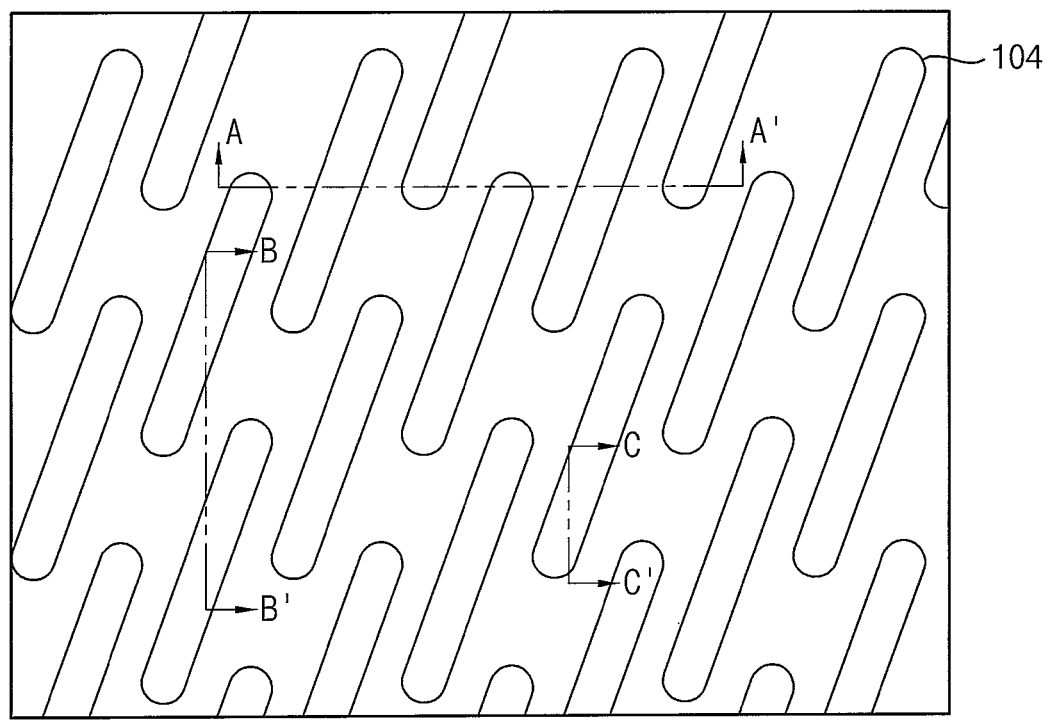
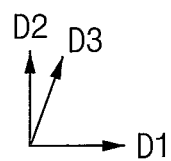

FIG. 8
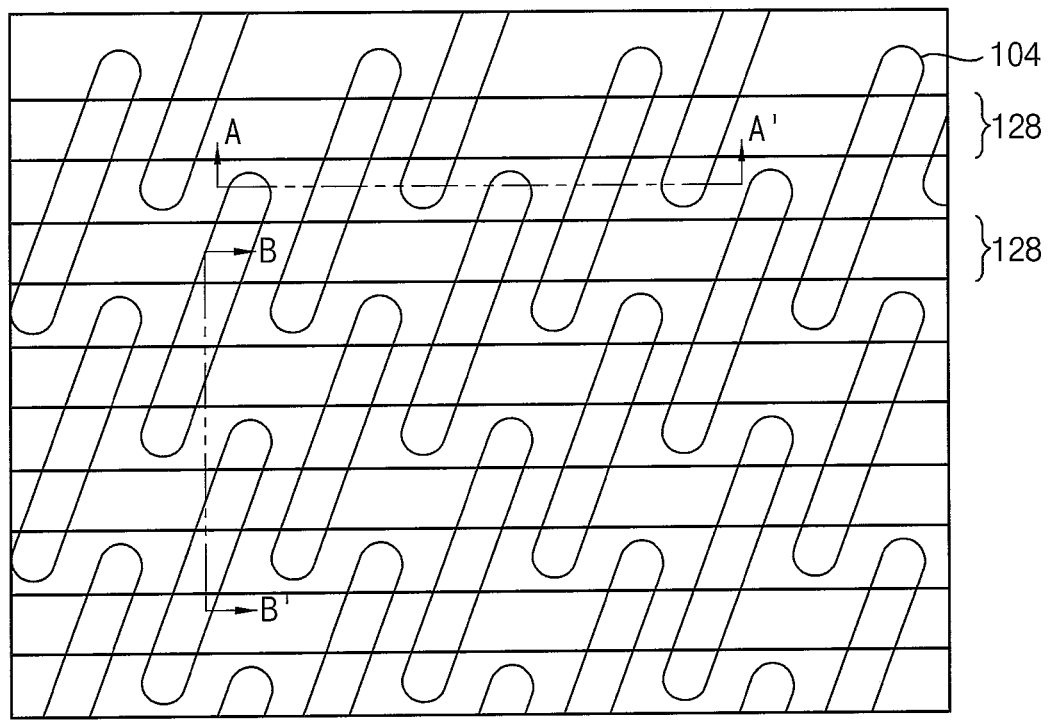
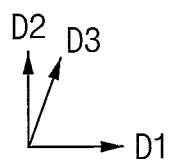

FIG. 9
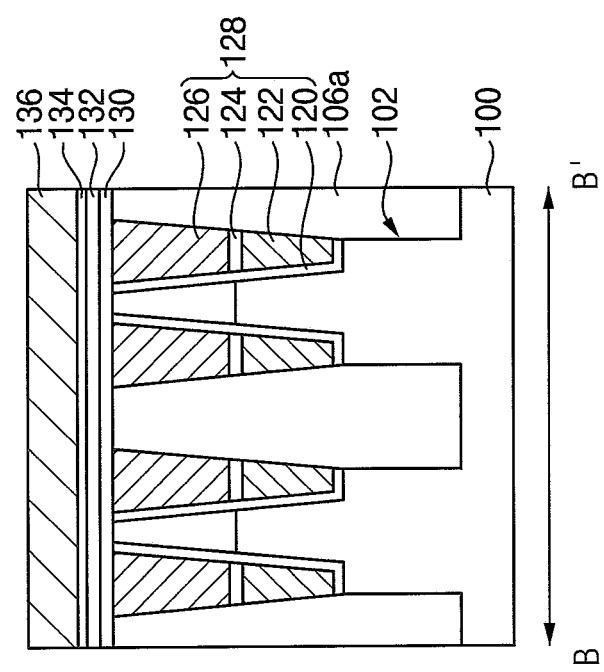
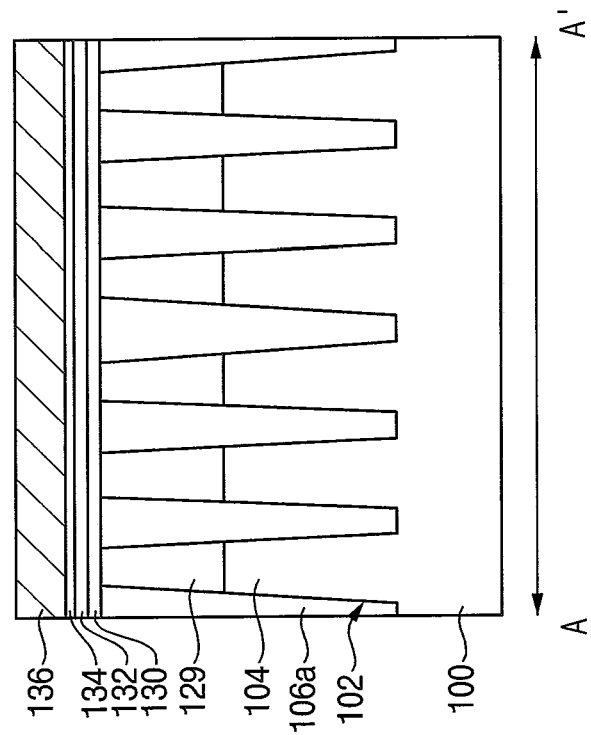

FIG. 14
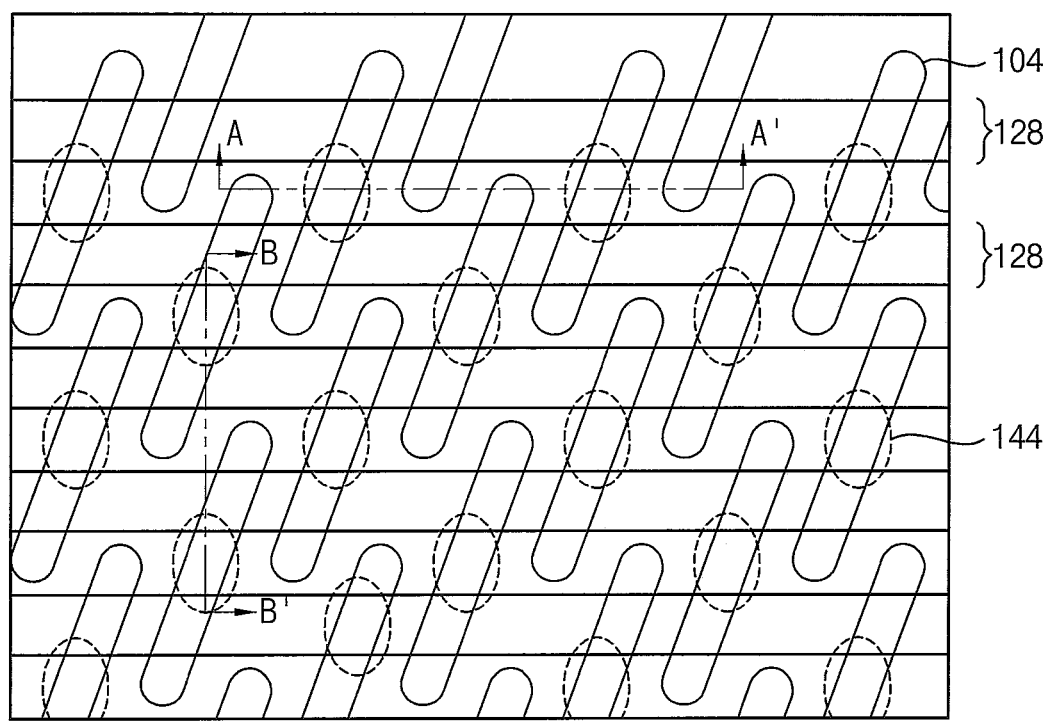
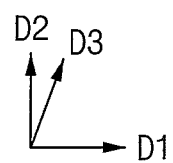

SEMICONDUCTOR DEVICES

CROSS-REFERENCE TO RELATED APPLICATION

Korean Patent Application No. 10-2020-0132672, filed on Oct. 14, 2020 in the Korean Intellectual Property Office, and entitled: "Semiconductor Devices," is incorporated by reference herein in its entirety.

BACKGROUND

1. Field

Example embodiments relate to a semiconductor device. More particularly, example embodiments relate to a dynamic random-access memory (DRAM) device.

2. Description of the Related Art

A semiconductor device may include a polysilicon pattern. For example, in a DRAM device, a bit line structure may include a polysilicon pattern, a metal barrier layer pattern, and a metal pattern stacked on top of each other.

SUMMARY

According to example embodiments, there is provided a semiconductor device that may include a substrate including an isolation layer pattern and an active pattern, a buffer insulation layer pattern on the substrate, a polysilicon structure on the active pattern and the buffer insulation layer pattern, a first diffusion barrier layer pattern on an upper surface of the polysilicon structure, a second diffusion barrier layer pattern including at least a metal on the first diffusion barrier layer pattern, and a first metal pattern and a first capping layer pattern stacked on the second diffusion barrier layer pattern. The polysilicon structure may extend in a direction parallel to an upper surface of the substrate. The first diffusion barrier layer pattern may include polysilicon doped with at least carbon.

According to example embodiments, there is provided a semiconductor device that may include a substrate including an isolation layer pattern and an active pattern, a gate structure formed in a gate trench at the isolation layer pattern and the active pattern, a plurality of buffer insulation layer patterns on the isolation layer pattern, the active pattern, and the gate structure, a bit line structure contacting an upper surface of the buffer insulation layer pattern and an upper surface of the active pattern between the buffer insulation layer patterns, a contact plug contacting the active pattern and being spaced apart from the bit line structure, and a capacitor contacting an upper surface of the contact plug. The gate structure may extend in a first direction parallel to an upper surface of the substrate. The bit line structure may extend in a second direction parallel to the upper surface of the substrate and perpendicular to the first direction. The contact plug may include at least polysilicon. The bit line structure may include a polysilicon structure on the active pattern and the buffer insulation layer pattern, a first diffusion barrier layer pattern on an upper surface of the polysilicon structure, and a second diffusion barrier layer pattern, a first metal pattern, and a first capping layer pattern sequentially stacked on the first diffusion barrier layer pattern. The first diffusion barrier layer pattern may include polysilicon doped with at least carbon.

According to example embodiments, there is provided a semiconductor device that may include a polysilicon structure on a substrate, a first diffusion barrier layer pattern on a surface of the polysilicon structure, and a first metal pattern and a first capping layer pattern stacked on the first diffusion barrier layer pattern. The first diffusion barrier layer pattern may include polysilicon doped with carbon. The carbon included in the first diffusion barrier layer pattern may have in a range of about 1 at. % to about 5 at. %.

According to example embodiments, there is provided a method of manufacturing a semiconductor device. In the method, a buffer insulation layer pattern may be formed on a substrate including an isolation layer pattern and an active pattern. A polysilicon structure may be formed on the active pattern and the buffer insulation layer pattern. The polysilicon structure may contact a portion of the active pattern. The polysilicon structure may extend in a direction parallel to an upper surface of the substrate. A source gas including carbon may be doped on an upper surface of the polysilicon structure to form a first diffusion barrier layer pattern including polysilicon doped with at least carbon on the upper surface of the polysilicon structure. A second diffusion barrier layer pattern may be formed on the first diffusion barrier layer pattern. The second diffusion barrier layer pattern may include at least a metal. A first metal pattern and a first capping layer pattern may be stacked on the second diffusion barrier layer pattern.

BRIEF DESCRIPTION OF THE DRAWINGS

Features will become apparent to those of skill in the art by describing in detail exemplary embodiments with reference to the attached drawings, in which:

FIGS. 3 to 21 are cross-sectional views and plan views of stages in a method of manufacturing a semiconductor device in accordance with example embodiments.

DETAILED DESCRIPTION

Figure 1:
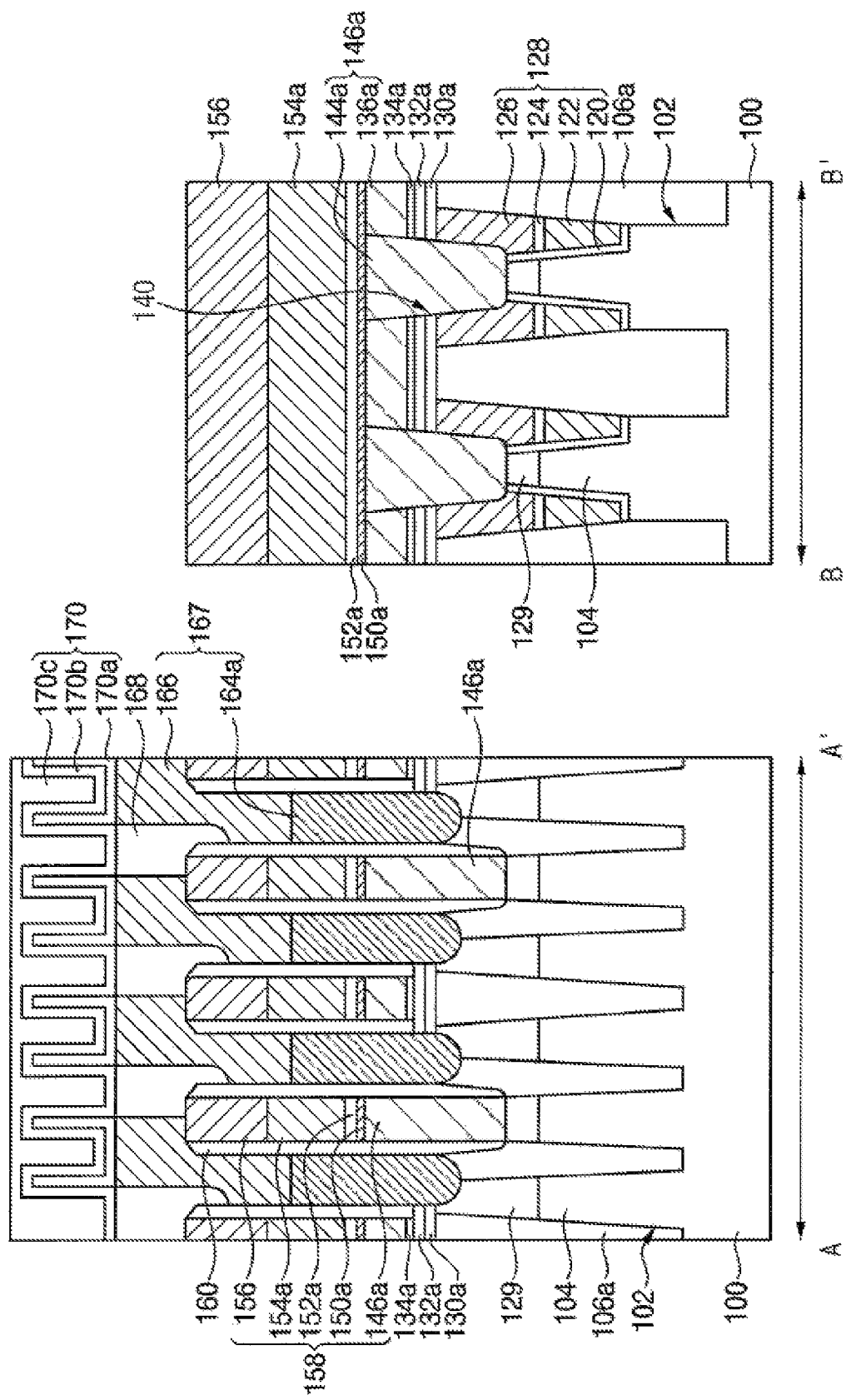
FIGS. 1 and 2 are cross-sectional views and a plan view of semiconductor devices in accordance with example embodiments.
Figure 2:
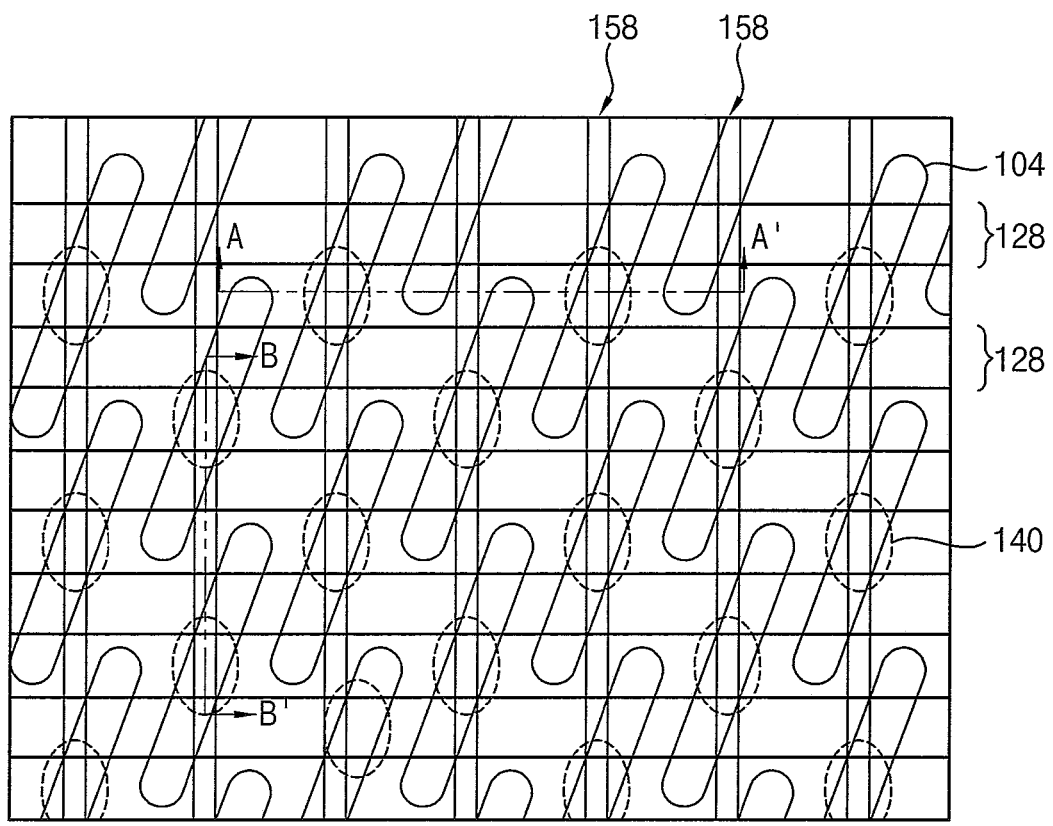

FIG. 1 illustrates cross-sectional views of semiconductor devices in accordance with example embodiments, and FIG. 2 illustrates a plan view of semiconductor devices in accordance with example embodiments. FIG. 1 illustrates cross-sectional views taken along lines A-A' and B-B' of FIG. 2.

Hereinafter, one direction parallel to an upper surface of a substrate is referred to as a first direction D1, and a direction parallel to the upper surface of the substrate and perpendicular to the first direction D1 is referred to as a second direction D2. A vertical direction is perpendicular to the upper surface of the substrate.

Referring to FIGS. 1 and 2, a semiconductor device may include gate structures 128 buried in a substrate 100, and bit line structures 158, spacers 160, contact plug structures 167, and capacitors 170 formed on the substrate 100.

For example, the substrate 100 may include silicon, germanium, silicon-germanium, or a III-V group compound, e.g., GaP, GaAs, or GaSb. In another example, the substrate 100 may be a silicon-on-insulator (SOI) substrate or a germanium-on-insulator (GOI) substrate.

A trench 102 may be formed in the substrate 100, and an isolation layer pattern 106*a* may be formed in the trench 102. The isolation layer pattern 106a may include, e.g., an insulation material such as silicon oxide or silicon nitride.

A protruding portion of the substrate 100 on which the trench 102 is not formed is referred to as an active pattern 104. An upper surface of the substrate 100 on which the trench 102 is not formed (i.e., an upper surface of the active pattern 104) may serve as an active region.

In example embodiments, the active region may have an isolated island shape, as illustrated by the active patterns 104 in FIG. 2. The active region may be disposed in a third direction D3 which is oblique to the first direction D1. The third direction D3 may be a longitudinal direction of the active region. In cross-sectional views, inner widths of the trenches 102 may vary depending on a space between the active patterns 104. That is, the inner widths of the trenches 102 may be different for each position of the substrate 100.

A gate trench may be formed at portions of the active pattern 104 and the isolation layer pattern 106a. The gate structure 128 may be formed in the gate trench. The gate structure 128 may extend in the first direction D1. The plurality of gate structures 128 may be spaced apart to each other in the second direction D2. The gate structure 128 may include a gate insulation layer 120, a gate electrode 122, a polysilicon pattern 124, and a first capping layer pattern 126.

Figure 6:
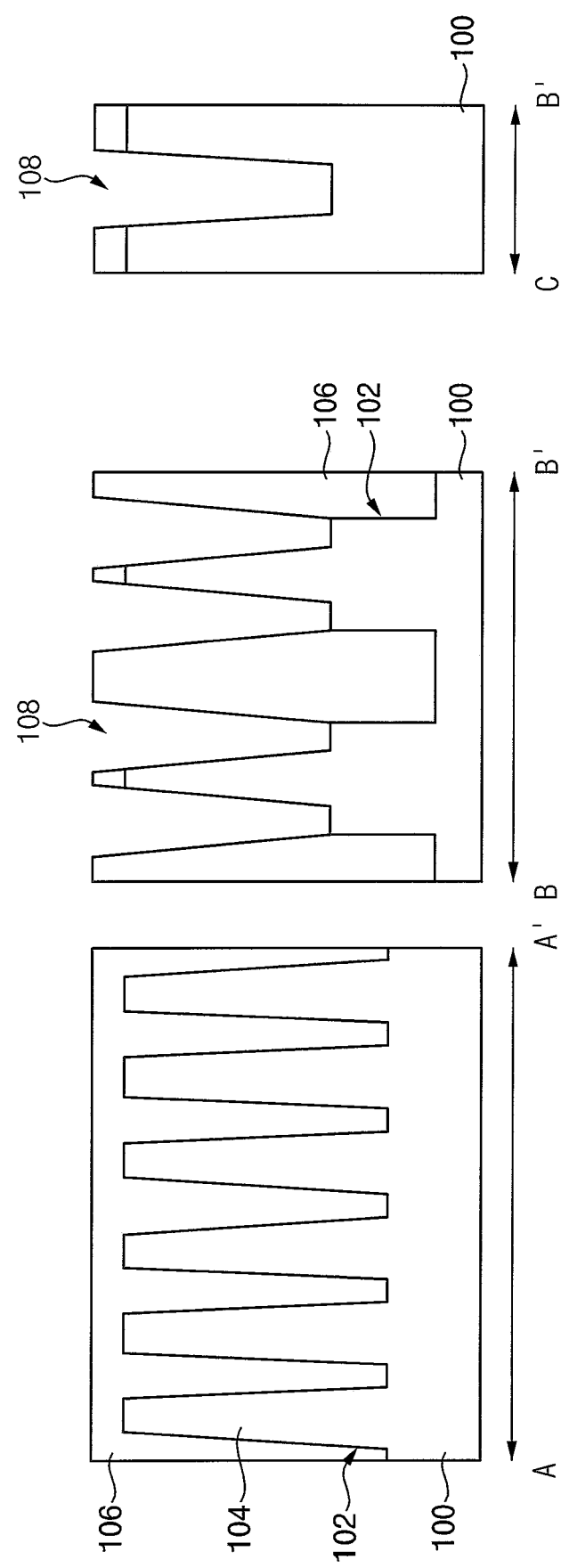

The gate insulation layer 120 may be conformally formed on an inner surface of a gate trench 108 (FIG. 6). The gate insulation layer 120 may include, e.g., silicon oxide. The gate electrode 122 may include, e.g., a metal. In example embodiments, the gate electrode 122 may include a barrier pattern and a metal pattern. The barrier pattern may include titanium (Ti), tantalum (Ta), tungsten nitride, titanium nitride, tantalum nitride, or the like, and the metal pattern may include tungsten. The first capping layer pattern 126 may include, e.g., silicon nitride.

Impurity regions 129 may be formed at an upper portion of the active pattern 104 adjacent to both sides of the gate structure 128. A bottom of the impurity region 129 may be positioned at a level between an upper surface and a lower surface of the polysilicon pattern 124.

A first buffer insulation layer pattern 130a, a second buffer insulation layer pattern 132a, and a third buffer insulation layer pattern 134a may be sequentially stacked on upper surfaces of the substrate 100, the isolation layer pattern 106a, and the first capping layer pattern 126. The first and third buffer insulation layer patterns 130a and 134a may include, e.g., silicon oxide. The second buffer insulation layer pattern 132a may include, e.g., silicon nitride.

In example embodiments, each of the first and second buffer insulation layer patterns 130a and 132a may have a thickness of about 35 angstroms to about 100 angstroms, e.g., in the vertical direction. In example embodiments, a thickness of the third buffer insulation layer pattern 134a may be less than a thickness of each of the first and second buffer insulation layer patterns 130a and 132a, e.g., in the vertical direction. In some example embodiments, the third buffer insulation layer pattern 134a may not be formed on the second buffer insulation layer patterns 132a.

The bit line structure 158 may have a structure in which a polysilicon structure 146a, a first diffusion barrier layer pattern 150a, a second diffusion barrier layer pattern 152a, a first metal pattern 154a, and a second capping layer pattern 156 are sequentially stacked. The bit line structure 158 may extend in the second direction D2.

A first portion of a bottom of the bit line structure 158 may contact an upper surface of the active pattern 104. A second portion of a bottom of the bit line structure 158 may contact an upper surface of the third buffer insulation layer pattern 134a. The first portion of the bit line structure 158 may contact the upper surface of the active pattern 104 corresponding to a center portion of the active region in the longitudinal direction.

In detail, the polysilicon structure 146a of the bit line structure 158 may, e.g., directly, contact the upper surface of the active pattern 104, e.g., the impurity region 129 in the upper portion of the active pattern 104, and the upper surface of the third buffer insulation layer pattern 134a, and may extend in the second direction D2. The polysilicon structure 146a may include polysilicon doped with N-type or P-type impurities. An upper surface of the polysilicon structure 146a may be substantially flat. Upper surfaces of a plurality of polysilicon structures 146a may be substantially coplanar with each other.

The first diffusion barrier layer pattern 150a may be formed, e.g., directly, on the upper surface of the polysilicon structure 146a, e.g., the first diffusion barrier layer pattern 150a may cover the entire upper surface of the polysilicon structure 146a. The first diffusion barrier layer pattern 150a may include, e.g., polysilicon doped with at least carbon.

The first diffusion barrier layer pattern 150a may serve as a barrier layer for preventing diffusion (i.e., movement) of silicon from the polysilicon structure 146a into a metal pattern positioned over the polysilicon structure 146a. Therefore, the first diffusion barrier layer pattern 150a may not include metal.

For example, the thickness of the first diffusion barrier layer pattern 150a may be less than a thickness of the second diffusion barrier layer pattern 152a. When the thickness of the first diffusion barrier layer pattern 150a is larger than that of the second diffusion barrier layer pattern 152a, the resistance of the bit line structure 158 may be increased.

In example embodiments, the first diffusion barrier layer pattern 150a may be carbon-doped polysilicon. The carbon may be included in the first diffusion barrier layer pattern 150a at about 1 atomic % (at. %) to about 5 at. %, based on a total amount of atoms in the first diffusion barrier layer pattern 150a. For example, the carbon may be included in the first diffusion barrier layer pattern 150a at about 1.5 at. %. When the carbon is included in the first diffusion barrier layer pattern 150a at about 5 at. % or higher, the resistance of the bit line structure 158 may increase, thereby causing formation of a bit line structure having a target low resistance difficult. When the carbon is included in the first diffusion barrier layer pattern 150a at less than 1 at. %, preventing diffusion (i.e., movement) of the silicon included in the polysilicon structure may be difficult.

In example embodiments, the first diffusion barrier layer pattern 150a may include polysilicon doped with carbon and further nitrogen. In example embodiments, nitrogen may be included in the first diffusion barrier layer pattern 150a at about 2 at. % to about 10 at. %, based on a total amount of atoms in the first diffusion barrier layer pattern 150a. When the nitrogen is included in the first diffusion barrier layer pattern 150a at more than 10 at. %, the resistance of the bit line structure 158 may be increased.

The second diffusion barrier layer pattern 152a may be formed to prevent diffusion of metal included in the first metal pattern 154a thereon. Further, the second diffusion barrier layer pattern 152a may be interposed between the first diffusion barrier layer pattern 150a and the first metal pattern 154a, so that an adhesion between the first diffusion barrier layer pattern 150a and the first metal pattern may be increased. As the second diffusion barrier layer pattern 152a is included, the resistance of the bit line structure 158 may be decreased.

The second diffusion barrier layer pattern 152a may include a metal, e.g., a tantalum-containing layer, a titanium-containing layer, or a tungsten-containing layer. In example embodiments, the second diffusion barrier layer pattern 152a may include silicon-doped titanium nitride (TSN), Ti, TiN, TaC, TaCN, TaSiN, TaN, WN, or the like.

The second diffusion barrier layer pattern 152a may have a thickness of about 10 angstroms to about 50 angstroms, e.g., about 25 angstroms to about 35 angstroms. When the thickness of the second diffusion barrier layer pattern 152a is less than 10 angstroms, preventing diffusion of the metal included in the first metal pattern 154a may be difficult. When the thickness of the second diffusion barrier layer pattern 152a is greater than 50 angstroms, the resistance of the bit line structure 158 may be increased.

The first metal pattern 154a may include a metal material having a resistance lower than a resistance of the second diffusion barrier layer pattern 152a. For example, the first metal pattern 154a may include tungsten.

The second capping layer pattern 156 may include, e.g., silicon nitride. The spacers 160 may be formed on, e.g., entire, sidewalls of the bit line structure 158 and the third buffer insulation layer pattern 134a.

A portion of the active pattern 104 contacting the bit line structure 158 may be recessed rather than the active pattern 104 positioned under the first buffer insulation layer pattern 130a. For example, as illustrated in FIG. 1, a portion of the bit line structure 158 (e.g., a second polysilicon pattern 144a on the right side of FIG. 1) may extend through the first to third buffer insulation layer patterns 130a to 134a into a recess in a top of the active pattern 104, e.g., into a recess in the top of the active pattern 104 and the impurity region 129. That is, as illustrated in FIGS. 1-2, a first opening 140 may be formed at a portion of the active pattern 104, and a bottom of the bit line structure 158 (e.g., the second polysilicon pattern 144a) may fill the first opening 140 to contact a bottom of the first opening 140. The active pattern 104 and the isolation layer pattern 106a between the bit line structures 158 may also be partially recessed.

Insulation patterns may be formed between the bit line structures 158. The insulation patterns may include, e.g., nitride such as silicon nitride. A second opening 162 (FIG. 19) may be defined as an isolated space between the bit line structures 158 and the insulation patterns. An upper surface of an edge of the active region in the longitudinal direction may be exposed by a bottom of the second opening 162.

A lower contact plug 164a may be formed to fill a lower portion of the second opening 162, and the lower contact plug 164a may contact the active pattern 104 exposed by the second opening 162. The lower contact plug 164a may include polysilicon doped with impurities.

An upper contact plug 166 may, e.g., directly, contact the lower contact plug 164a. An upper surface of the upper contact plug 166 may be higher than an upper surface of the bit line structure 158. That is, a contact plug structure 167 may include the lower contact plug 164a and the upper contact plug 166 stacked. The upper surface of the contact plug structure 167 may be higher than the upper surface of the bit line structure 158.

A third opening may be formed between the upper contact plugs 166, and an upper insulation pattern 168 may fill the third opening. The upper contact plug 166 may include a barrier metal layer pattern and a second metal pattern. The upper contact plug 166 may serve as a pad electrode electrically connected to a lower electrode 170a of the capacitor 170. The capacitor 170 may contact the upper surface of the upper contact plug 166.

In the semiconductor device, the bit line structure 158 may include the polysilicon structure 146a, the first diffusion barrier layer pattern 150a, the second diffusion barrier layer pattern 152a, the first metal pattern 154a, and the second capping layer patterns 156 sequentially stacked. If the first diffusion barrier layer pattern 150a is not formed, voids may be generated in an upper portion of the polysilicon structure by a Kirkendall effect. However, in example embodiments, the first diffusion barrier layer pattern 150a is formed between the polysilicon structure 146a and the second diffusion barrier layer pattern 152a, thereby preventing voids from forming in the polysilicon structure 146a due to the Kirkendall effect. Therefore, the bit line structure 158 may have the target low resistance, and the semiconductor device may have high reliability.

FIGS. 3 to 21 are cross-sectional views and plan views illustrating stages in a method of manufacturing a semiconductor device in accordance with example embodiments. In detail, FIGS. 4, 8 and 14 are plan views, and FIGS. 3, 5 to 7, 9 to 13, and 15 to 21 are cross-sectional views. In this case, each of FIGS. 3, 5 to 7, 9 to 13, and 15 to 21 includes cross-sectional views along lines A-A' and B-B' of the plan views. In addition, each of FIGS. 6 and 7 further includes a cross-sectional view along line C-C' of the plan views.

Figure 3:
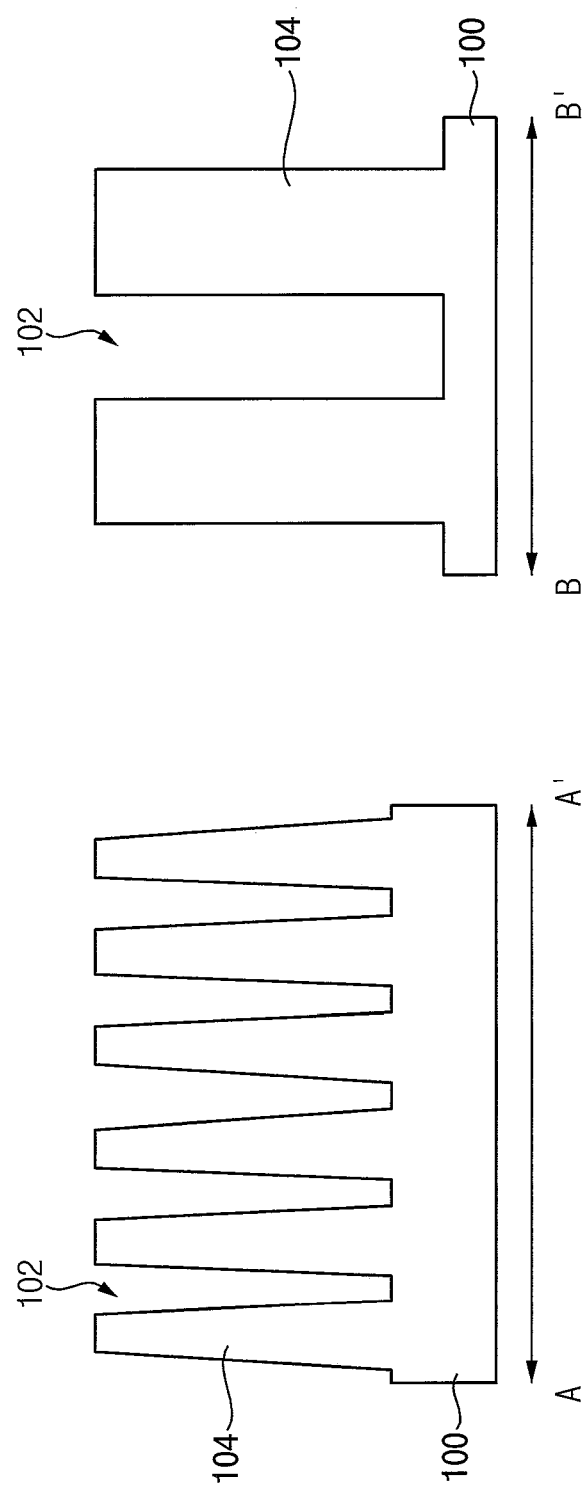

Referring to FIGS. 3 and 4, a first mask pattern may be formed on the substrate 100. The first mask pattern may selectively cover a portion for forming an active region in the substrate 100. An upper portion of the substrate 100 may be etched using the first mask pattern as an etching mask to form the trench 102 at a field region of the substrate 100. A protruding portion of the substrate 100 on which the trench 102 is not formed may serve as the active pattern 104.

Figure 5:
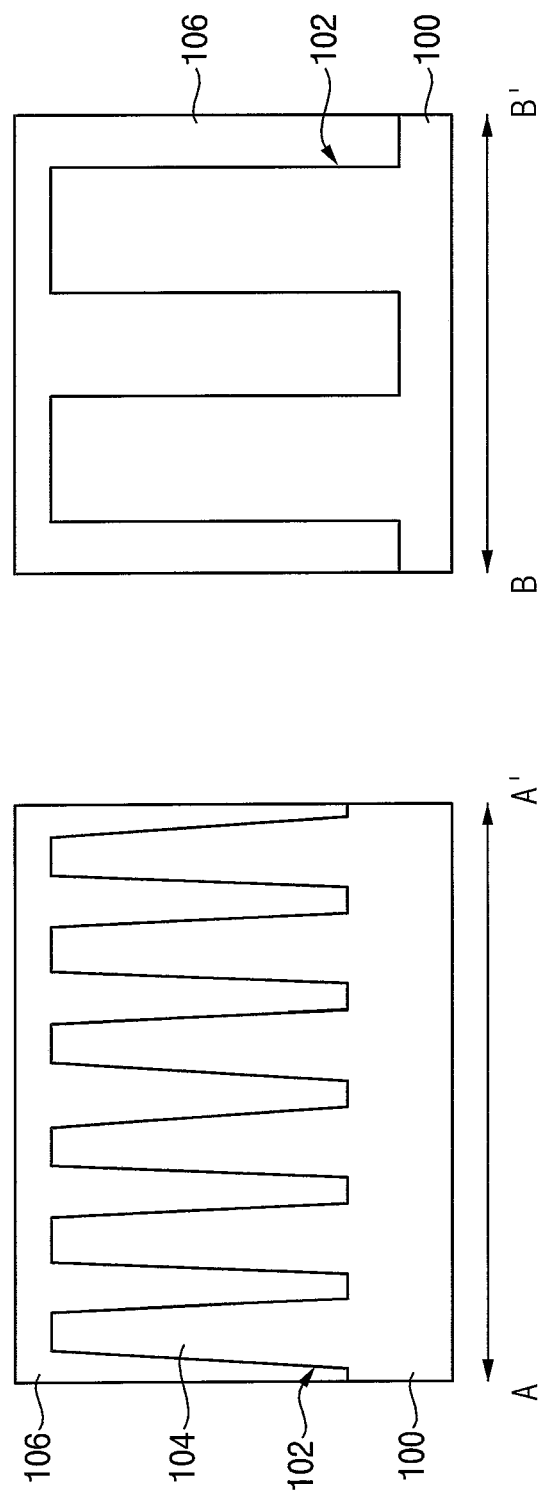

Referring to FIG. 5, an isolation layer 106 may be formed on the active pattern 104 to fill the trench 102. The isolation layer 106 may be formed to completely fill the trench 102. A planarization process may be performed so that an upper surface of the isolation layer 106 may be substantially flat. The planarization process may include chemical mechanical polishing (CMP) and/or an etch back process.

The isolation layer 106 may include an insulation material, e.g., silicon oxide, silicon nitride, etc. For example, the isolation layer 106 may include silicon oxide. The isolation layer 106 may be formed to have a single layer or to have stacked two or more layers.

In example embodiments, before forming the isolation layer 106, a polysilicon layer may be conformally formed on an inner surface of the trench 102 and a surface of the substrate 100, and the polysilicon layer may be thermally oxidized to form an oxide layer the inner surface of the trench 102.

Referring to FIG. 6, second mask patterns for forming a gate trench 108 may be formed on the isolation layer 106. The second mask pattern may extend in the first direction. The second mask patterns may be formed to expose a portion for forming a gate structure. That is, a portion between the second mask patterns may correspond to the portion for forming the gate structure. Upper portions of the isolation layer 106 and the substrate 100 may be etched to form the gate trench 108 extending in the first direction.

Figure 7:
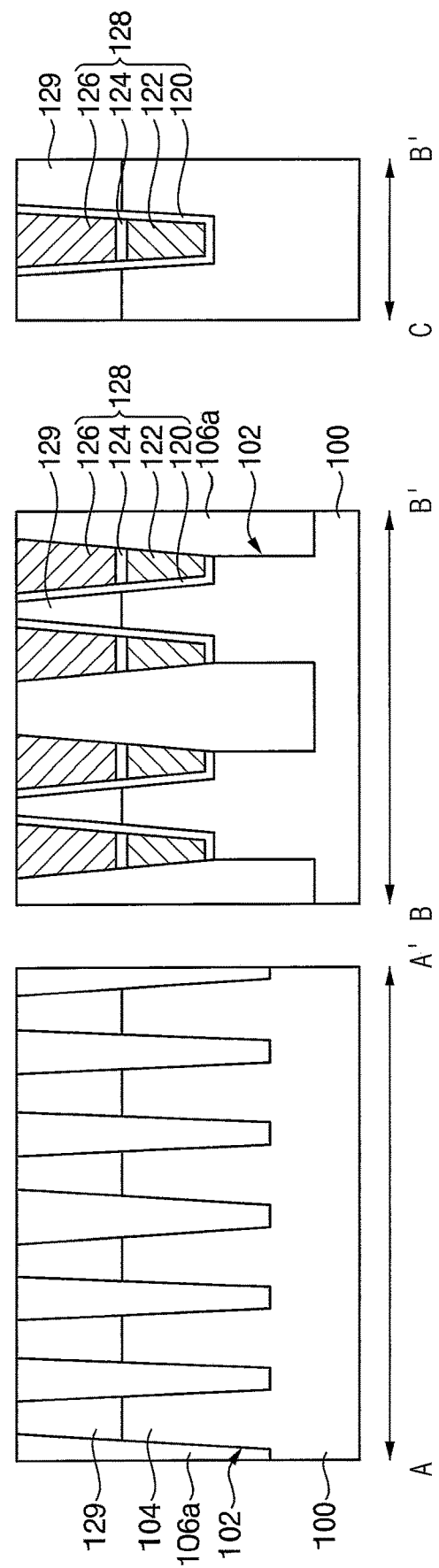

Referring to FIGS. 7 and 8, the gate insulation layer 120 may be conformally formed in the gate trench 108, and a gate electrode layer may be formed on the gate insulation layer 120. Thereafter, the gate electrode layer may be partially etched by an etching back process to form the gate electrode 122 filling a lower portion of the gate trench 108.

In example embodiments, the gate electrode 122 may include a barrier pattern and a metal pattern. In example embodiments, a polysilicon pattern 124 may be further formed on the gate electrode 122.

A first capping layer may be formed on the polysilicon pattern 124 to completely fill the gate trench 108. The first capping layer may include silicon nitride.

The first capping layer may be partially removed so that the first capping layer may only remain at an inner portion of the gate trench 108. Thus, the first capping layer pattern 126 may be formed in the gate trench 108. The removing process may include an etching back process or chemical mechanical polishing process.

By performing the above process, the gate structure 128 including the gate insulation layer 120, the gate electrode 122, the polysilicon pattern 124, and the first capping layer pattern 126 may be formed in the gate trench 108. Thereafter, the second mask pattern may be removed, and the isolation layer 106 formed on the upper surface of the substrate 100 may be removed to form the isolation layer pattern 106a. Thus, upper surfaces of the substrate 100, the isolation layer pattern 106a, and the first capping layer pattern 126 may be exposed.

N-type impurities may be doped on the substrate 100 adjacent to both sides of the gate structure 128 to form the impurity regions 129. A bottom of the impurity region 129 may be positioned at a level between an upper surface and a lower surface of the polysilicon pattern 124.

Referring to FIG. 9, a first buffer insulation layer 130, a second buffer insulation layer 132, and a third buffer insulation layer 134 may be sequentially formed on upper surfaces of the active pattern 104, the isolation layer pattern 106a, and the first capping layer pattern 126. The first to third buffer insulation layers 130, 132, and 134 may be formed to insulate between conductive patterns (e.g., bit lines) subsequently formed and the active pattern 104.

The first and third buffer insulation layers 130 and 134 may include silicon oxide. The first and third buffer insulation layers 130 and 134 may be formed by an atomic layer deposition process.

The second buffer insulation layer 132 may serve as an etch stop layer. The second buffer insulation layer 132 may include an insulation material having a high etch selectivity with respect to the silicon oxide. The second buffer insulation layer 132 may include silicon nitride. The second buffer insulation layer 132 may be formed by an atomic layer deposition process.

In example embodiments, each of the first and second buffer insulation layers 130 and 132 may have a thickness of about 35 angstroms to about 100 angstroms. In example embodiments, a thickness of the third buffer insulation layer 134 may be less than a thickness of each of the first and second buffer insulation layers 130 and 132. In some example embodiments, the third buffer insulation layer may not be formed on the second buffer insulation layer 132.

A first polysilicon layer 136 may be formed on the third buffer insulation layer 134. The first polysilicon layer 136 may include polysilicon doped with N-type or P-type impurities. A portion of the first polysilicon layer 136 may serve as a lower portion of a bit line structure subsequently formed.

Figure 10:
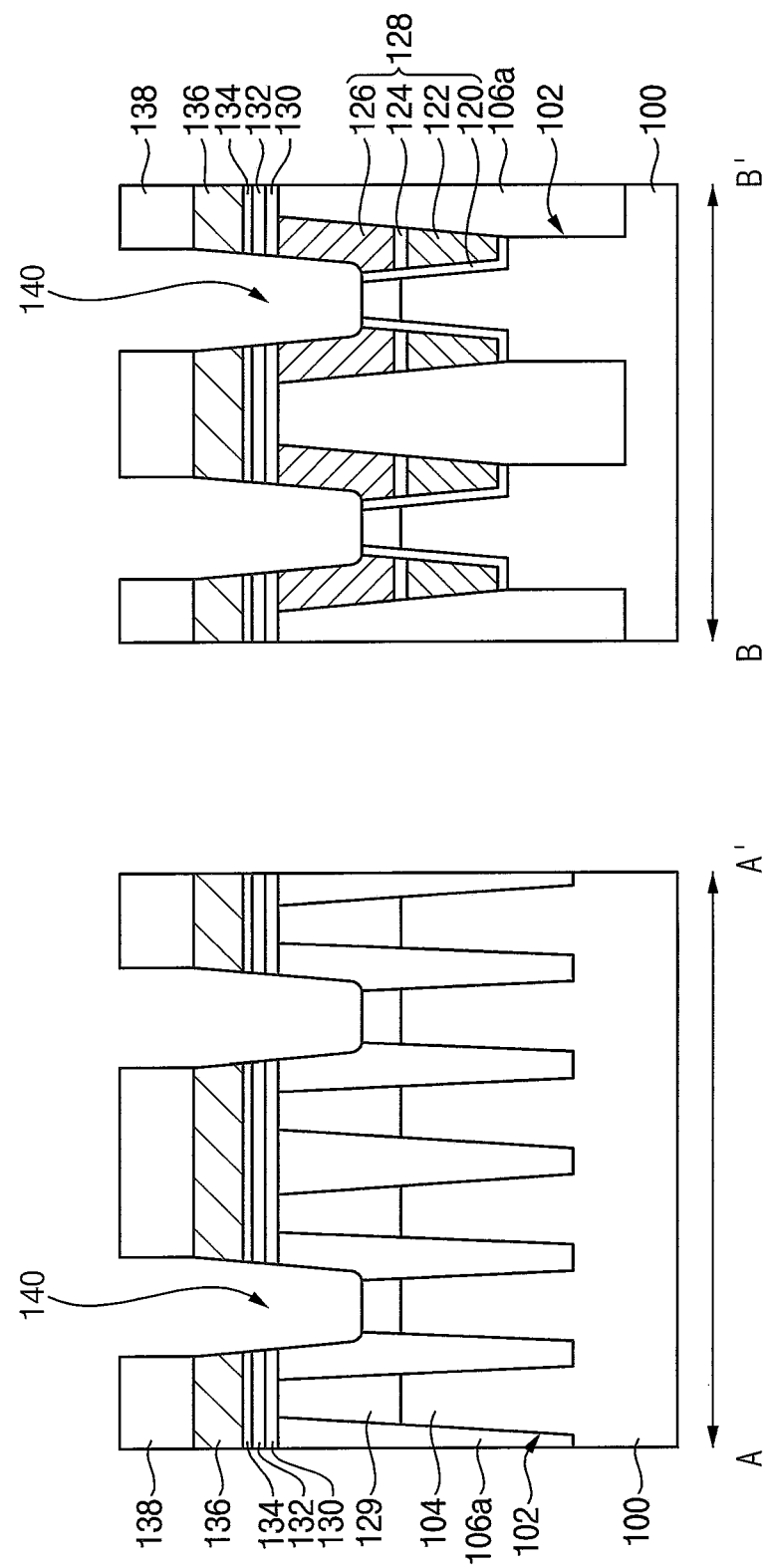

Referring to FIG. 10, a third mask pattern 138 may be formed on the first polysilicon layer 136. The third mask pattern 138 may selectively expose portions for forming bit line contacts. The third mask pattern 138 may include, e.g., silicon oxide.

The first polysilicon layer 136, the third buffer insulation layer 134, the second buffer insulation layer 132, and the first buffer insulation layer 130 may be etched using the third mask pattern 138 as an etching mask. Subsequently, an exposed active pattern 104, and the isolation layer pattern 106a and the gate structure 128 adjacent thereto may be partially etched together to form the first opening 140.

A center portion of the active region in the longitudinal direction may be exposed at a bottom of the first opening 140. By the etching process, an upper surface of the active pattern 104 exposed by the bottom of the first opening 140 may be lower than upper surfaces of other portions of the active pattern 104.

Figure 11:
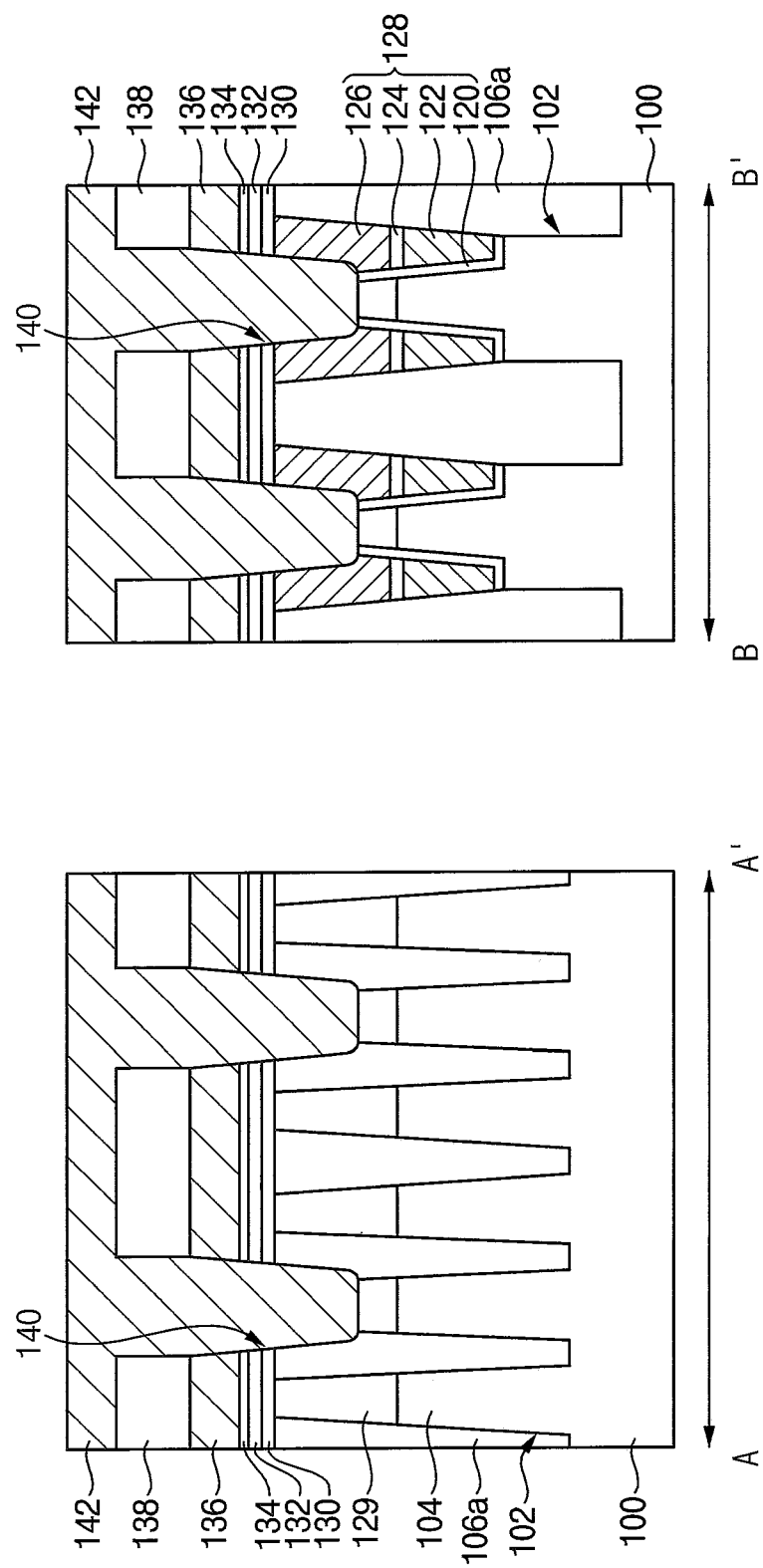

Referring to FIG. 11, a preliminary second polysilicon layer 142 may be formed on the third mask pattern 138 to completely fill the first opening 140. The preliminary second polysilicon layer 142 may include polysilicon doped with N-type or P-type impurities. The first polysilicon layer 136 and the preliminary second polysilicon layer 142 may include substantially the same material, and thus the first polysilicon layer 136 and the preliminary second polysilicon layer 142 may be merged with each other.

Figure 12:
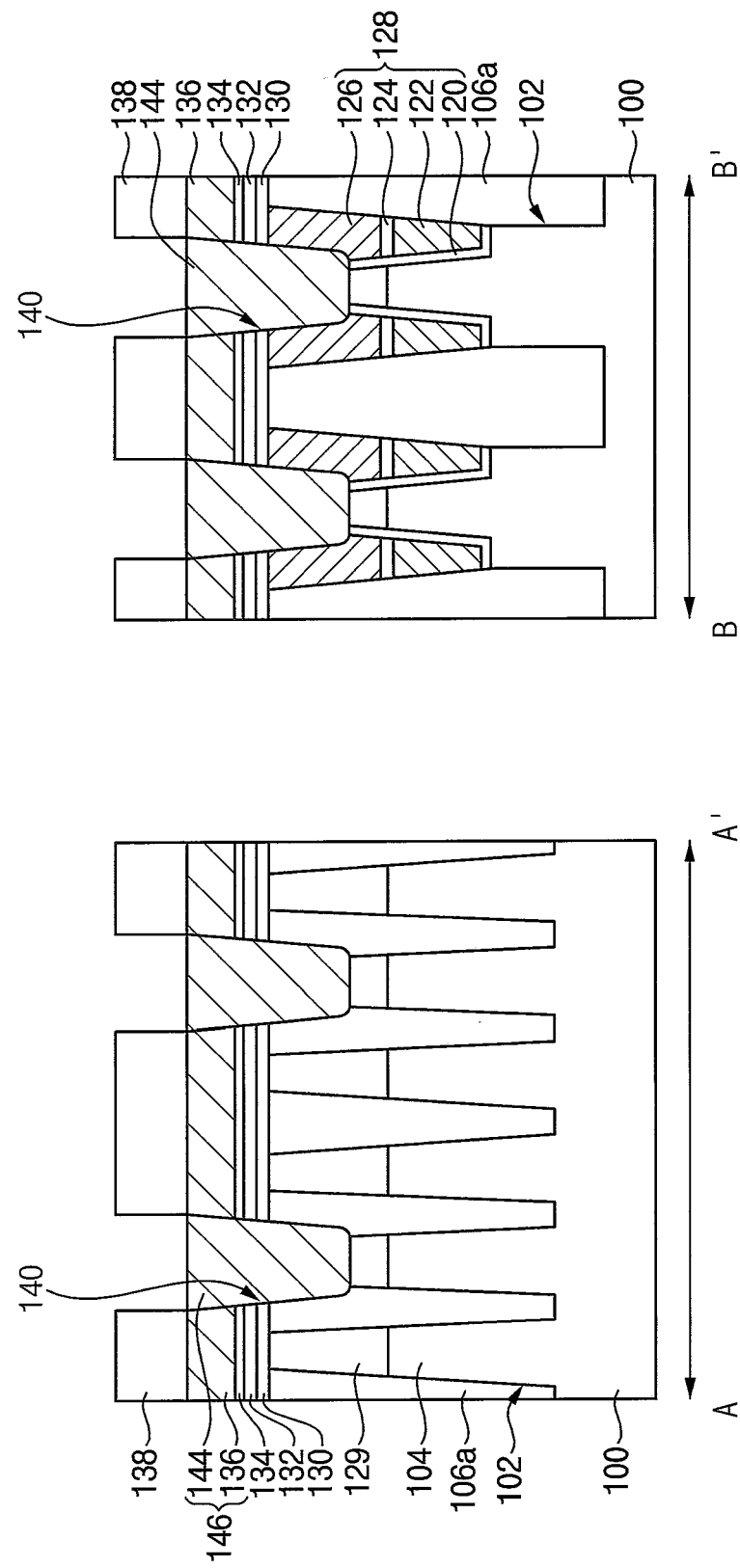

Referring to FIG. 12, an upper portion of the preliminary second polysilicon layer 142 may be etched by an etching back process to form a second polysilicon layer 144 filling the first opening 140.

After the etching back process, the second polysilicon layer 144 may have an upper surface substantially coplanar with an upper surface of the first polysilicon layer 136. That is, the upper surface of the second polysilicon layer 144 may be positioned at a level substantially the same as a level of the upper surface of the first polysilicon layer 136. When the etching back process is performed, the preliminary second polysilicon layer 142 formed on the third mask pattern 138 may be completely removed.

Figure 13:
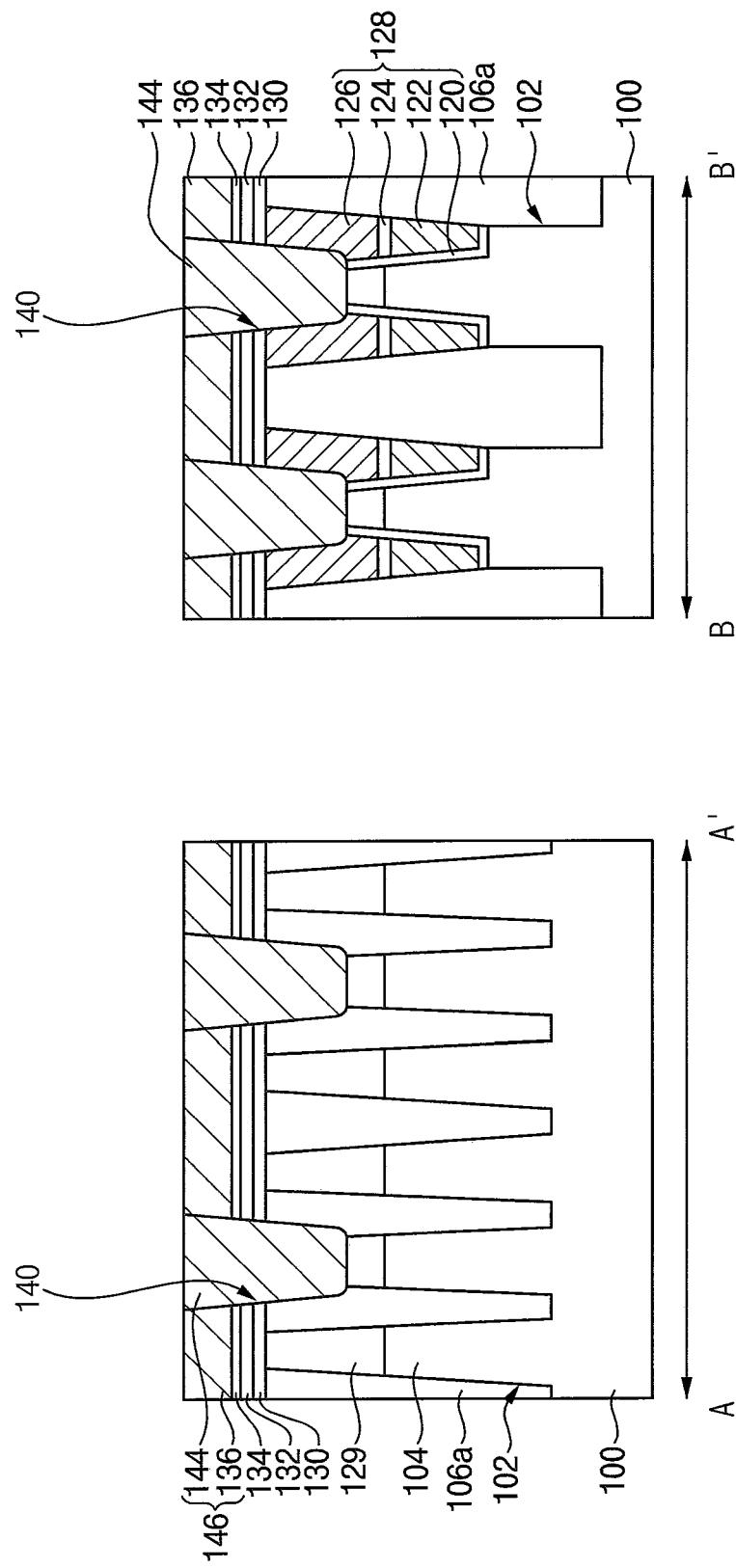

Referring to FIGS. 13 and 14, the third mask pattern 138 may be removed by a removing process. The removing process may include a wet etching process. Thus, the first polysilicon layer 136 may be disposed on the third buffer insulation layer 134, and the second polysilicon layer 144 may be disposed in the first opening 140. The second polysilicon layer 144 may contact the upper surface of the active pattern 104, e.g., the upper surface of the active pattern 104 and of the impurity region 129. The first and second polysilicon layers 136 and 144 may be merged with each other, so that the first and second polysilicon layers 136 and 144 may serve as a preliminary polysilicon structure 146.

Figure 15:
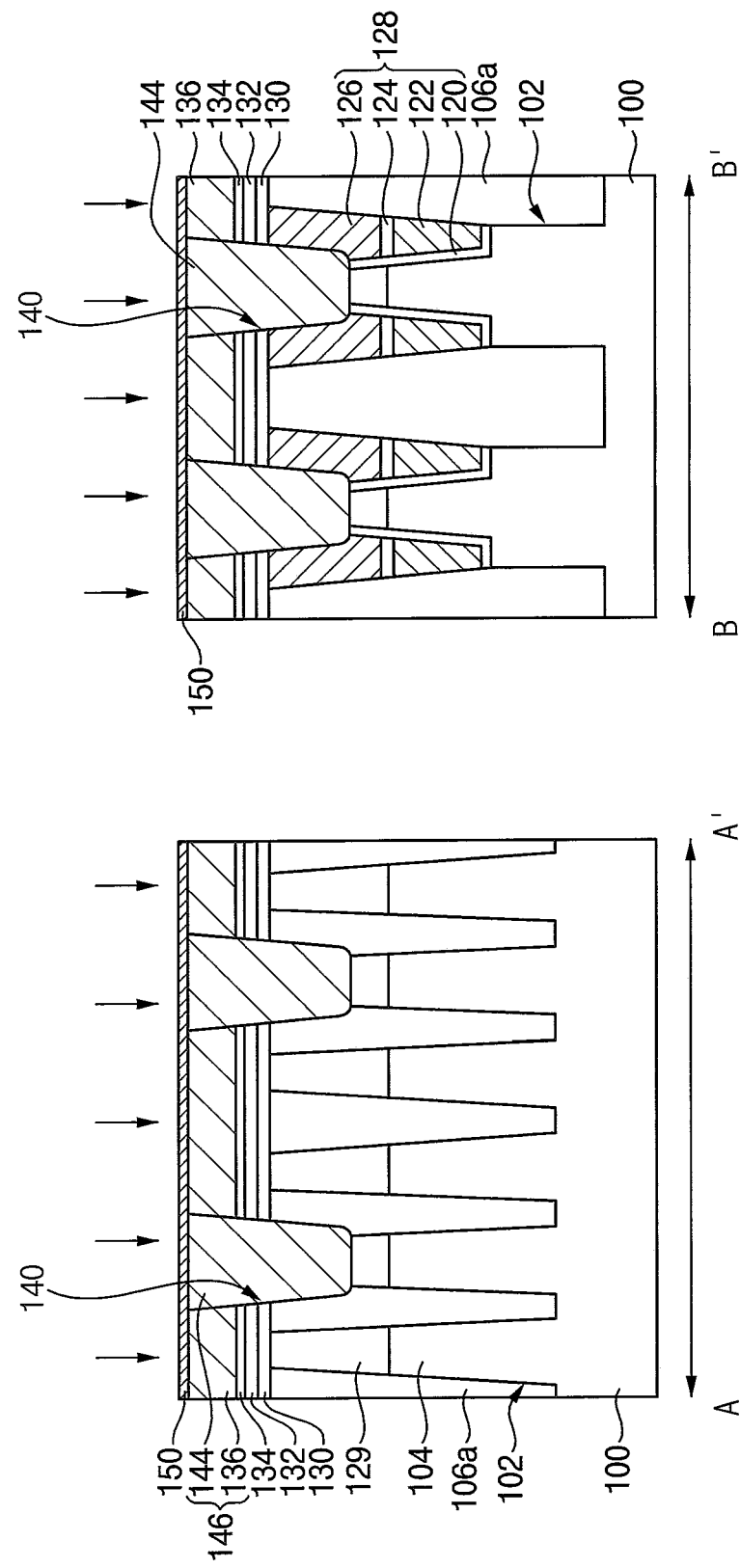

Referring to FIG. 15, an upper surface of the preliminary polysilicon structure 146 may be doped with at least carbon to form a first diffusion barrier layer 150 on the upper surface of the preliminary polysilicon structure 146. For example, referring to FIG. 15, carbon may be doped into the upper surface of the preliminary polysilicon structure 146, such that an upper portion of the preliminary polysilicon structure 146 (i.e., the portion with the doped carbon) may transform into the first diffusion barrier layer 150. Therefore, the first diffusion barrier layer 150 may include polysilicon doped with at least carbon, i.e., carbon-doped polysilicon.

The first diffusion barrier layer 150 may serve as a barrier layer for preventing diffusion (i.e., movement) of silicon from the preliminary polysilicon structure 146 into a layer including metal over the preliminary polysilicon structure 146. Therefore, the first diffusion barrier layer 150 may not include a metal.

Even if the first diffusion barrier layer 150 is included, a total resistance of the bit line structure may not increase, or the bit line structure may have a target low resistance. Therefore, the first diffusion barrier layer 150 may be stably combined with the polysilicon layers formed thereunder and a layer including metal (i.e., a second diffusion barrier layer) subsequently formed thereon. Further, when subsequent processes are performed, the first diffusion barrier layer 150 may be stably positioned on the upper surface of the preliminary polysilicon structure 146. To this end, the first diffusion barrier layer 150 may include at least carbon.

An amount of the carbon included in the first diffusion barrier layer 150 may be adjusted so that the bit line structure may have the target low resistance. When the carbon included in the first diffusion barrier layer 150 is at 5 at. % or more, the resistance of the bit line structure 158 may be increased. Thus, forming the bit line structure with the target low resistance may be difficult. When the carbon included in the first diffusion barrier layer 150 is at less than 1 at. %, preventing diffusion (i.e., movement) of the silicon may be difficult. Therefore, the carbon included in the first diffusion barrier layer 150 may be adjusted to be in a range of about 1 at. % to about 5 at. %, e.g., about 1.5 at. %.

When the first diffusion barrier layer 150 has a thick thickness, the resistance of the bit line structure may be increased. Preferably, the first diffusion barrier layer 150 may have a very thin thickness. Therefore, the first diffusion barrier layer 150 may not be formed by a deposition process. In example embodiments, the first diffusion barrier layer 150 may have a thickness less than a thickness of a second diffusion barrier layer (refer to FIG. 14, 152) subsequently formed.

In example embodiments, the first diffusion barrier layer 150 may be formed by a doping process using a source gas including at least carbon. The first diffusion barrier layer 150 may be formed by a gas phase doping process or an ion implantation process. Preferably, the first diffusion barrier layer 150 may be formed by the gas phase doping process. In this case, impurities may be only doped on the surface of the preliminary polysilicon structure 146, so that the first diffusion barrier layer 150 may have very thin thickness, e.g., carbon impurities may be doped only on the upper surface of the preliminary polysilicon structure 146 to provide a very thin first diffusion barrier layer 150 with a concentration of carbon at about 1 at. % to about 5 at. % on the upper surface of the preliminary polysilicon structure 146.

The source gas used in the doping process may include at least carbon, and may further include H, N and/or Si. For example, the source gas may include DIPAS (diisopropylamino silane), $CH_4$ gas, $C_2H_4$ gas, $C_2H_6$ gas, $C_3H_6$ gas, $C_3H_8$ gas, or the like.

In example embodiments, the gas phase doping process may be performed at a temperature of about 450° C. to about 500° C. When the gas phase doping process is performed at a temperature lower than 450° C., it may be difficult to decompose the source gas. When the gas phase doping process is performed at a temperature higher than 500° C., it may be difficult for the source gas to be only doped on a surface of a layer.

In example embodiments, the first diffusion barrier layer 150 may be polysilicon doped with carbon and further doped with nitrogen. A portion of the nitrogen may be doped in the first diffusion barrier layer 150 by doping the source gas. A portion of the nitrogen may be doped in the first diffusion barrier layer 150 by diffusing from the second diffusion barrier layer subsequently formed. In example embodiments, the nitrogen included in the first diffusion barrier layer 150 may be in a range of about 2 at. % to about 10 at. %. When the nitrogen included in the first diffusion barrier layer 150 is at more than 10 at. %, the resistance of the bit line structure may increase.

Figure 16:
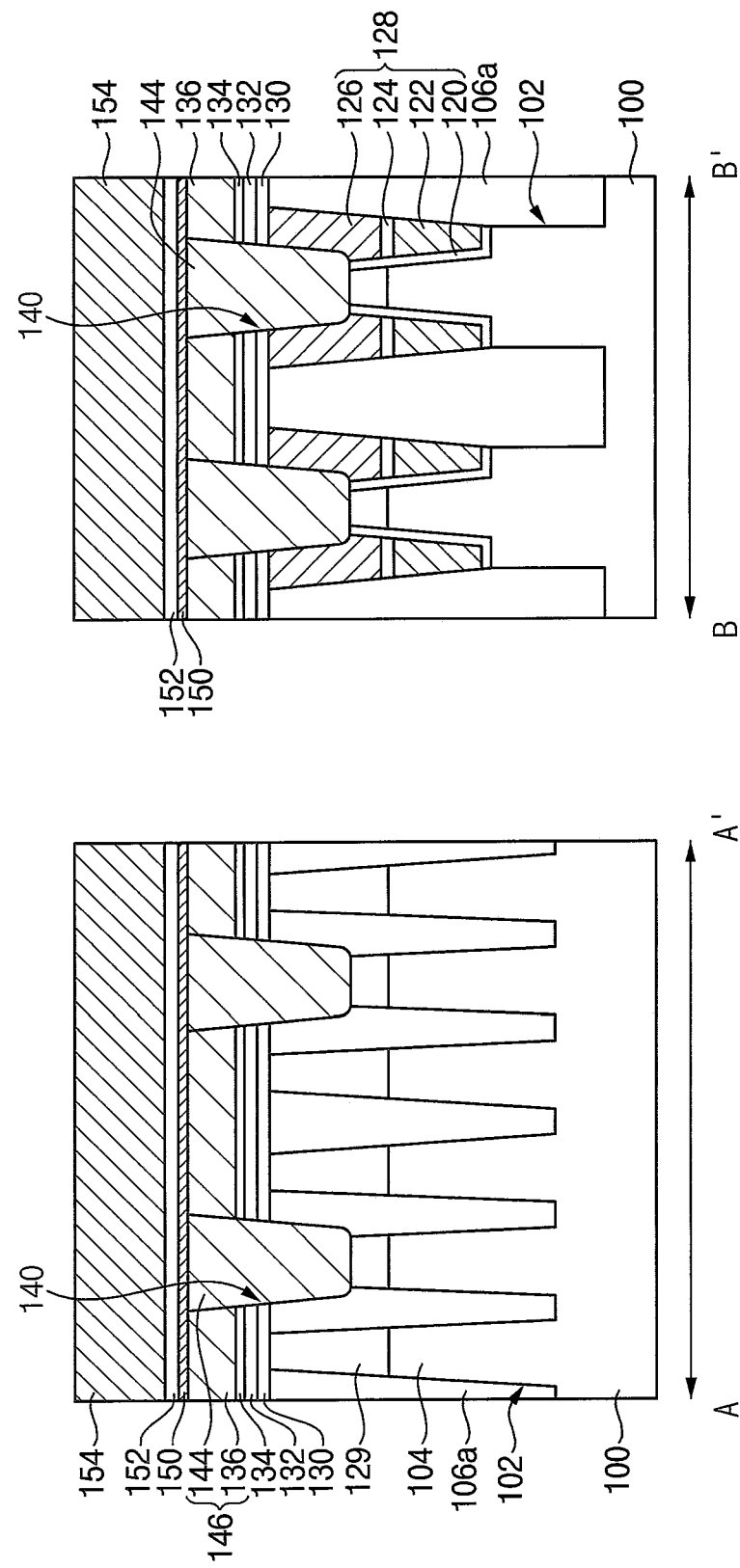

Referring to FIG. 16, the second diffusion barrier layer 152 may be formed on the first diffusion barrier layer 150. A first metal layer 154 may be formed on the second diffusion barrier layer 152.

The second diffusion barrier layer 152 may be formed to prevent diffusion of metal included in the first metal layer 154 thereon. The second diffusion barrier layer 152 may be interposed between the first diffusion barrier layer 150 and the first metal layer 154, so that an adhesion between the first diffusion barrier layer 150 and the first metal layer 154 may be increased. Formation of the second diffusion barrier layer 152 on the first diffusion barrier layer 150 may decrease the overall resistance of the bit line structure 158.

The second diffusion barrier layer 152 may include a metal layer, e.g., a tantalum containing layer, a titanium containing layer, or a tungsten containing layer. In example embodiments, the second diffusion barrier layer 152 may include silicon-doped titanium nitride (TSN), Ti, TiN, TaC, TaCN, TaSiN, TaN, WN, or the like.

The second diffusion barrier layer 152 may be formed by an atomic layer deposition process. The second diffusion barrier layer 152 may be formed to have a thickness of about 10 angstroms to about 50 angstroms. When the second diffusion barrier layer 152 has a thickness less than 10 angstroms, preventing diffusion of metal may be difficult. When the second diffusion barrier layer pattern 152a has a thickness greater than 50 angstroms, the resistance of the bit line structure 158 may be increased. For example, preferably, the second diffusion barrier layer 152 may have a thickness of about 25 angstroms to about 35 angstroms.

The first metal layer 154 may include, e.g., tungsten. As the first metal layer 154 is included, the total resistance of the bit line structure 158 may be decreased.

Figure 17:
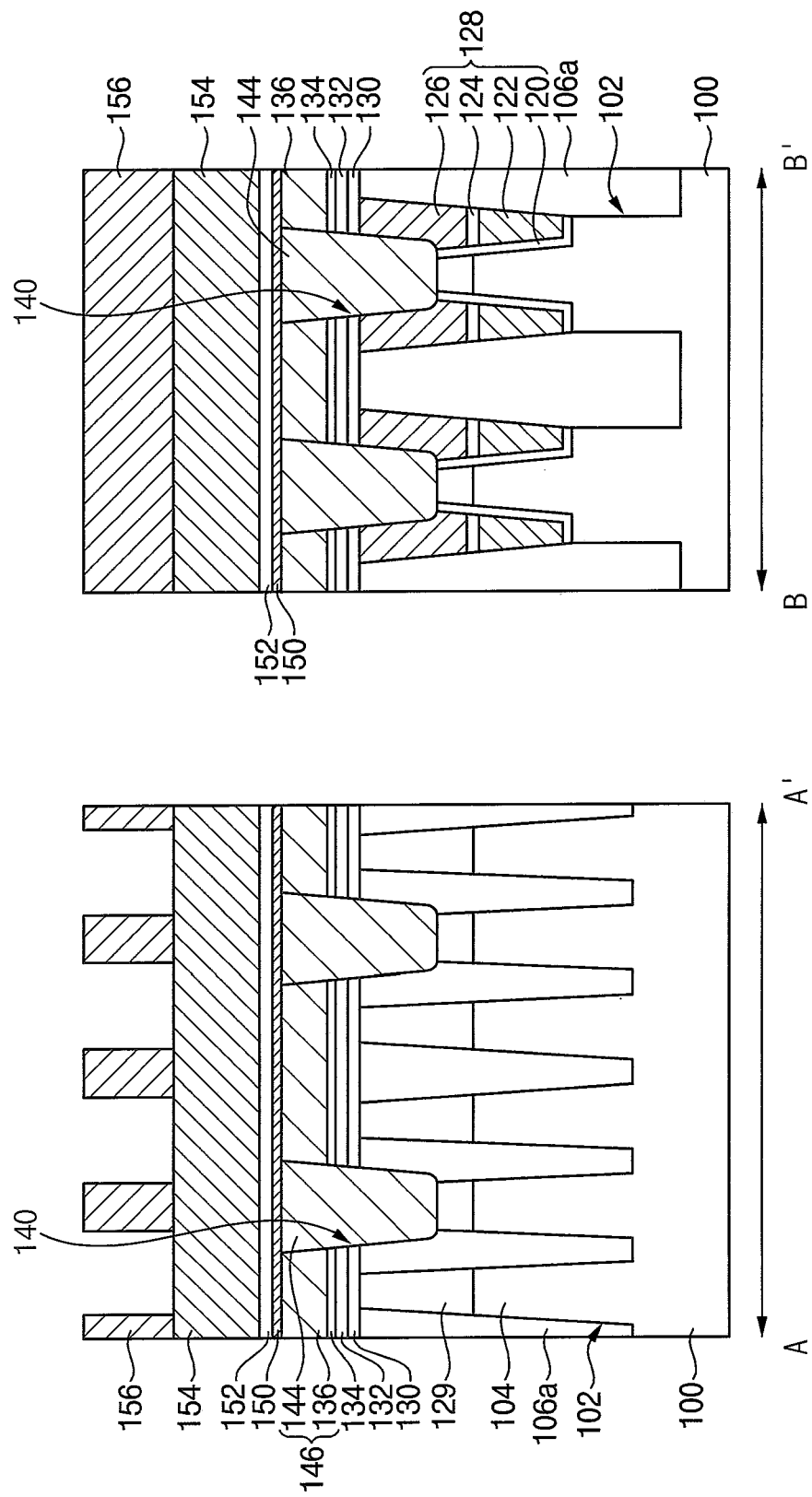

Referring to FIG. 17, a second capping layer may be formed on the first metal layer 154. The second capping layer may be patterned by a photolithography process to form a second capping layer pattern 156. In example embodiments, the second capping layer pattern 156 may include silicon nitride.

The second capping layer pattern 156 may serve as an etching mask for forming a bit line structure. Thus, the second capping layer pattern 156 may have a line shape extending in the second direction. A portion of the second capping layer pattern 156 may face the second polysilicon layer 144 filling the first opening 140.

Figure 18:
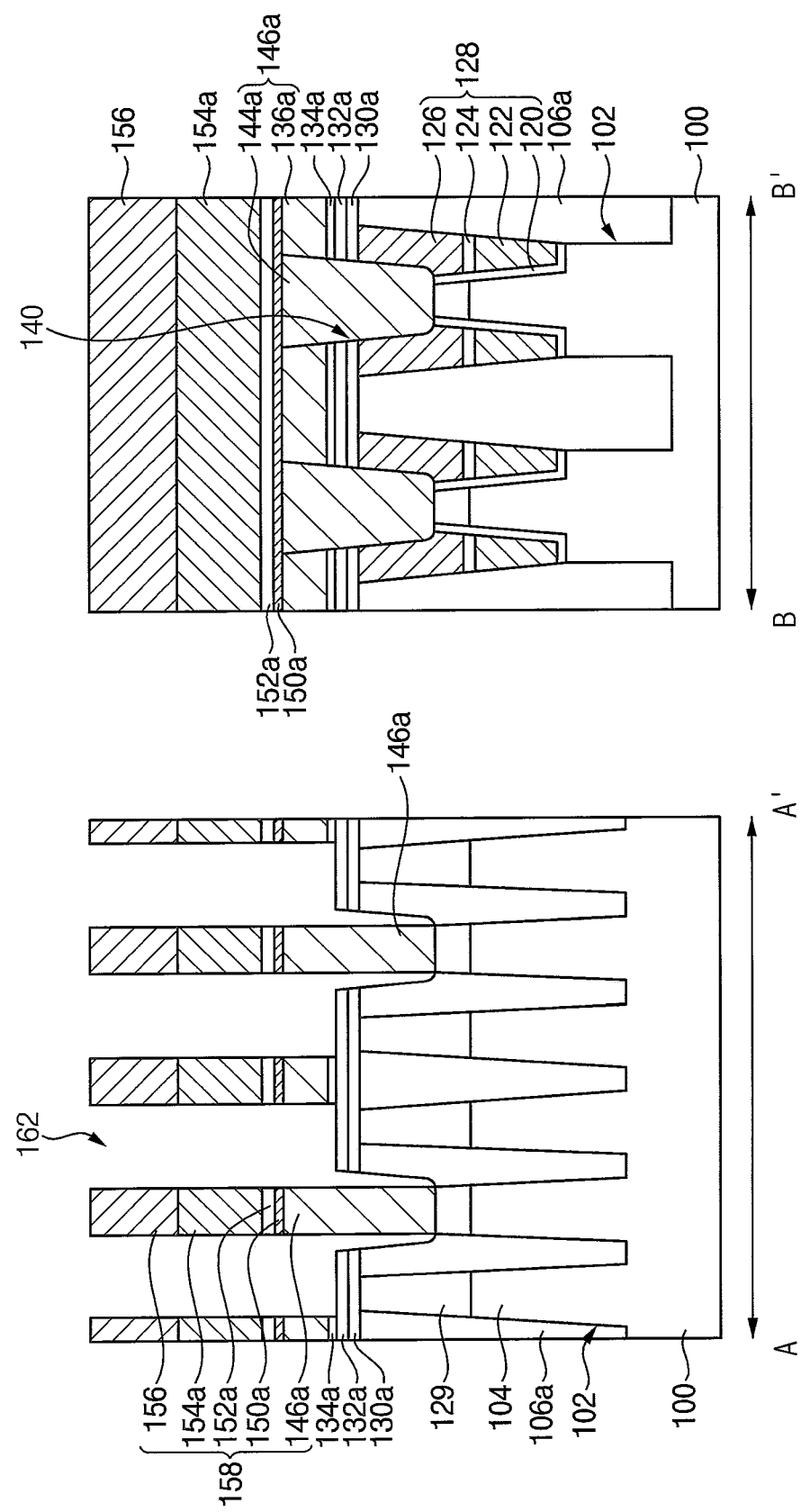

Referring to FIG. 18, the first metal layer 154, the second diffusion barrier layer 152, the first diffusion barrier layer 150, the preliminary polysilicon structure 146, and the third buffer insulation layer 134 may be sequentially etched using the second capping layer pattern 156 as an etching mask to form the bit line structure 158. The bit line structure 158 may include the polysilicon structure 146a, the first diffusion barrier layer pattern 150a, the second diffusion barrier layer pattern 152a, the first metal pattern 154a, and the second capping layer pattern 156 sequentially stacked.

The polysilicon structure 146a may include the first polysilicon pattern 136a contacting the upper surface of the active pattern 104, and the second polysilicon pattern 144a on the third buffer insulation layer pattern 134a. The second polysilicon pattern 144a may contact an upper sidewall of the first polysilicon pattern 136a.

A first portion of a bottom of the bit line structure 158 may contact the upper surface of the active pattern 104. A second portion of the bottom of the bit line structure 158 may contact an upper surface of the third buffer insulation layer pattern 134a formed by the etching the third buffer insulation layer 134.

In the bit line structure 158, as shown in FIG. 18, the first diffusion barrier layer pattern 150a and the second diffusion barrier layer pattern 152a may be disposed between the polysilicon structure 146a and the first metal pattern 154a. The first diffusion barrier layer pattern 150a including at least carbon and no metal may be disposed between the polysilicon structure 146a and the second diffusion barrier layer pattern 152a. The first diffusion barrier layer pattern 150a may prevent upward diffusion of silicon included in the polysilicon structure 146a.

Figure 19:
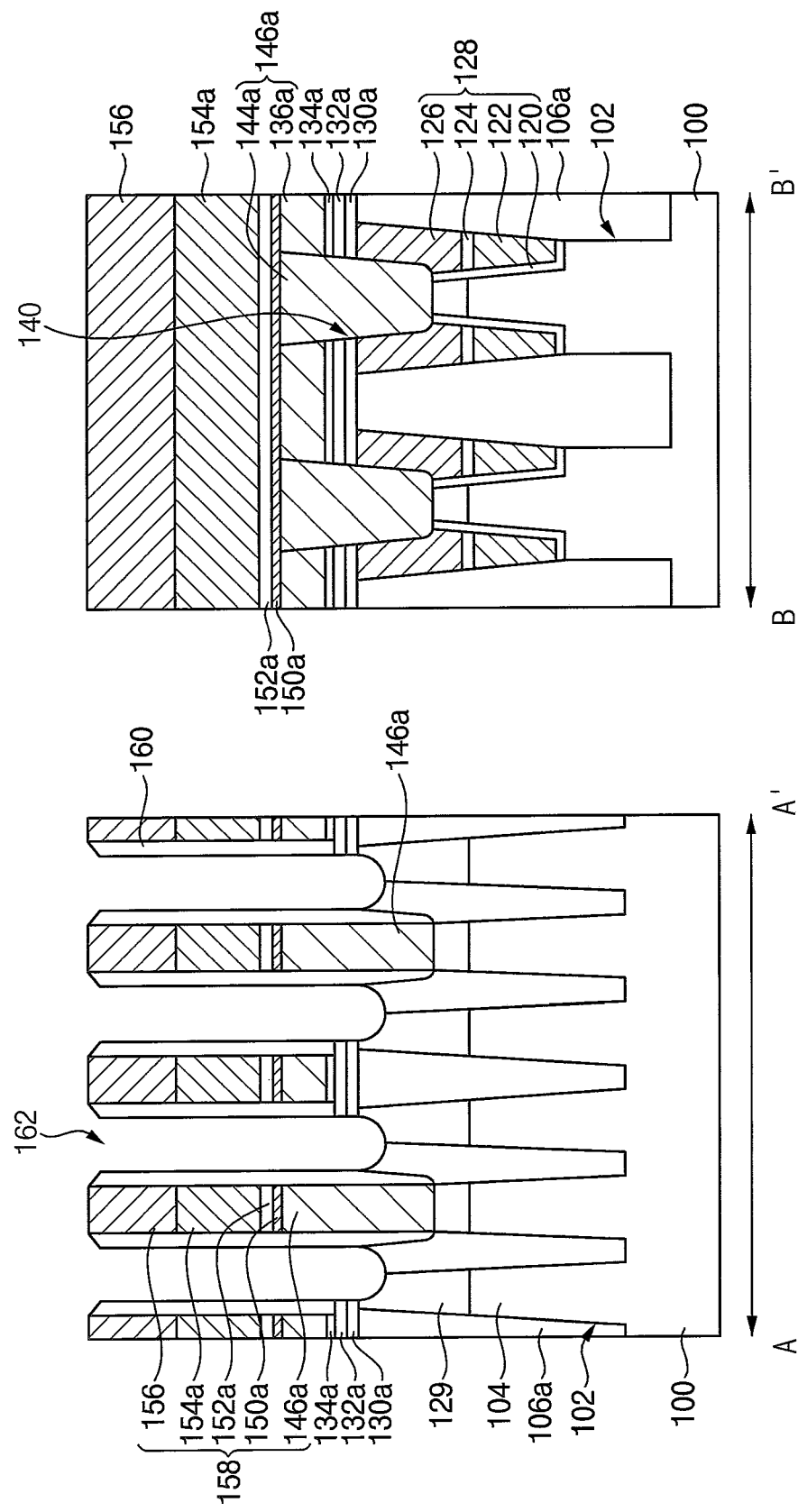

Referring to FIG. 19, the spacers 160 may be formed on sidewalls of the bit line structure 158 and the third buffer insulation layer pattern 134a. The spacer 160 may include an insulation material.

In example embodiments, the spacer 160 may be formed of a spacer structure in which a plurality of spacers is stacked. In some example embodiments, one of the spacers in the spacer structure may be an air spacer.

A first insulating interlayer may be formed to fill a space between the spacers 160 formed on the bit line structures 158. Thereafter, the first insulating interlayer may be planarized until an upper surface of the spacer 160 may be exposed. The first insulating interlayer may include silicon oxide.

A fourth mask pattern may be formed on the first insulating interlayer and the spacer 160. The first insulating interlayer may be etched using the fourth mask pattern as an etching mask to form an opening.

In example embodiments, the fourth mask pattern may extend in the first direction. A plurality fourth mask patterns may be spaced apart from each other in the second direction. In this case, the opening may be formed to overlap the gate structure 128. An insulation pattern may be formed to fill the opening. The insulation pattern may include a nitride, e.g., silicon nitride.

The first insulating interlayer may be etched, and then the second buffer insulation layer 132, the first buffer insulation layer 130, and an upper portion of the substrate 100 may be etched to form the second opening 162a exposing an upper surface of the substrate 100. In the etching process, an upper portion of the active pattern 104 and an upper portion of the isolation layer pattern 106a adjacent to the active pattern 104 may be etched together.

Figure 20:
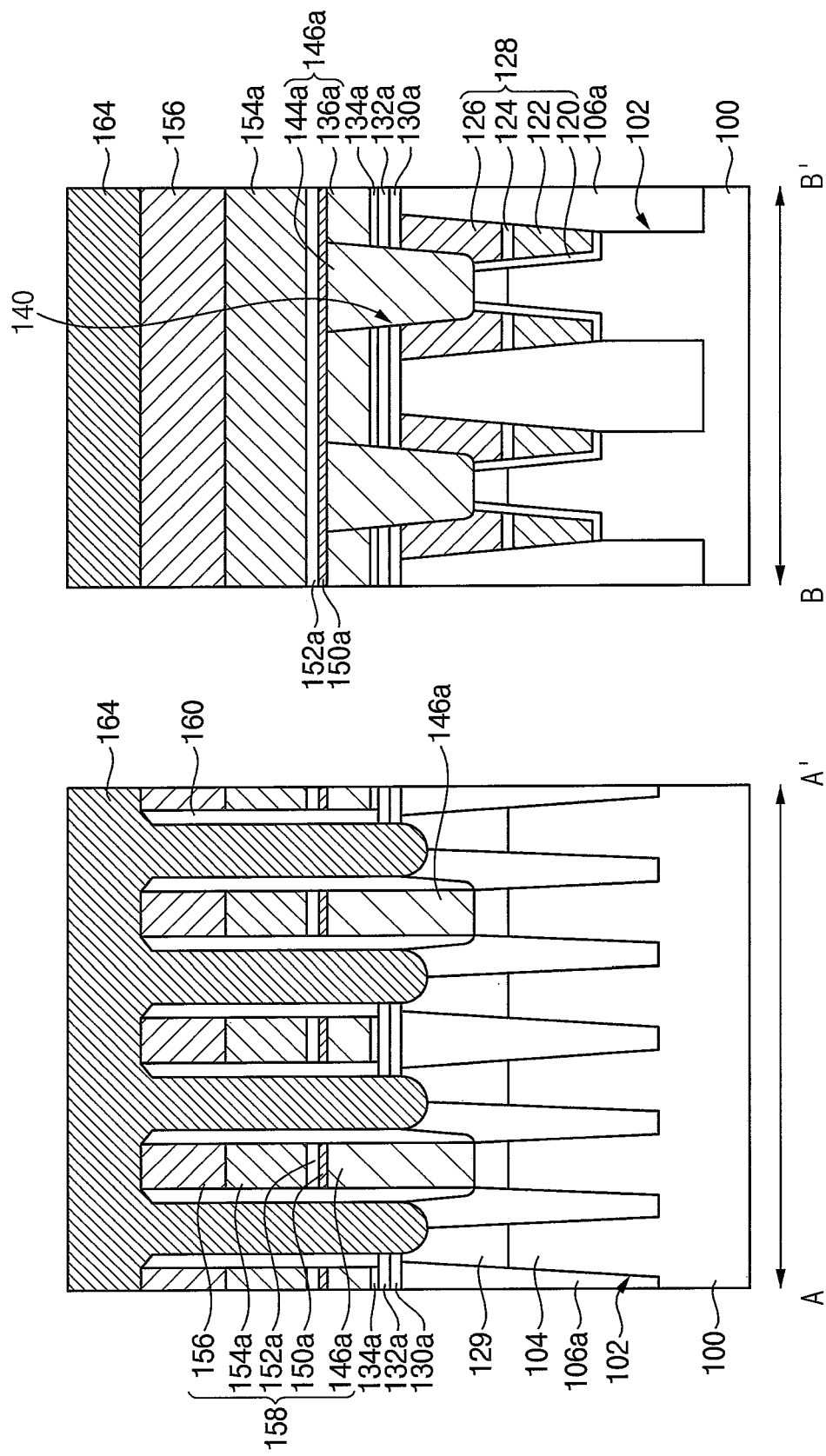

Referring to FIG. 20, a third polysilicon layer 164 may be formed to cover the bit line structure 158 while filling the second opening 162. The third polysilicon layer 164 may include polysilicon doped with N-type or P-type impurities.

The second opening 162 may extend from the upper surface of the bit line structure 158 to the surface of the substrate 100. As the semiconductor device is integrated, a space between the bit line structures 158 may be decreased, and thus an inner width of the second opening 162 may be decreased. The second opening 162 may have a high aspect ratio, so that voids may be generated in the third polysilicon layer 164 filling the second opening 162.

Heat treatment may be performed to remove the voids in the third polysilicon layer 164. The heat treatment may be performed at a high temperature of about 900° C. to about 1300° C. The heat treatment may include a laser annealing process.

In general, when the heat treatment process is performed and the first diffusion barrier layer pattern 150a is not formed, the silicon included in the polysilicon structure 146a in the bit line structure 158 may diffuse upward into overlying layers by the Kirkendall effect. When the silicon is diffused upward, voids may be generated in an upper portion of the polysilicon structure 146a, thereby increasing the resistance of the bit line structure 158 and causing reliability failure.

In contrast, in example embodiments, since the first diffusion barrier layer pattern 150a is doped with carbon and is positioned between the polysilicon structure 146a and the second diffusion barrier layer pattern 152a, the diffusion of silicon from the polysilicon structure 146a upward may be effectively prevented by the first diffusion barrier layer pattern 150a. Thus, voids in the polysilicon structure 146a may not be generated due to the Kirkendall effect, and the bit line structure 158 may have a target low resistance. Further, the semiconductor device may have high reliability.

Figure 21:
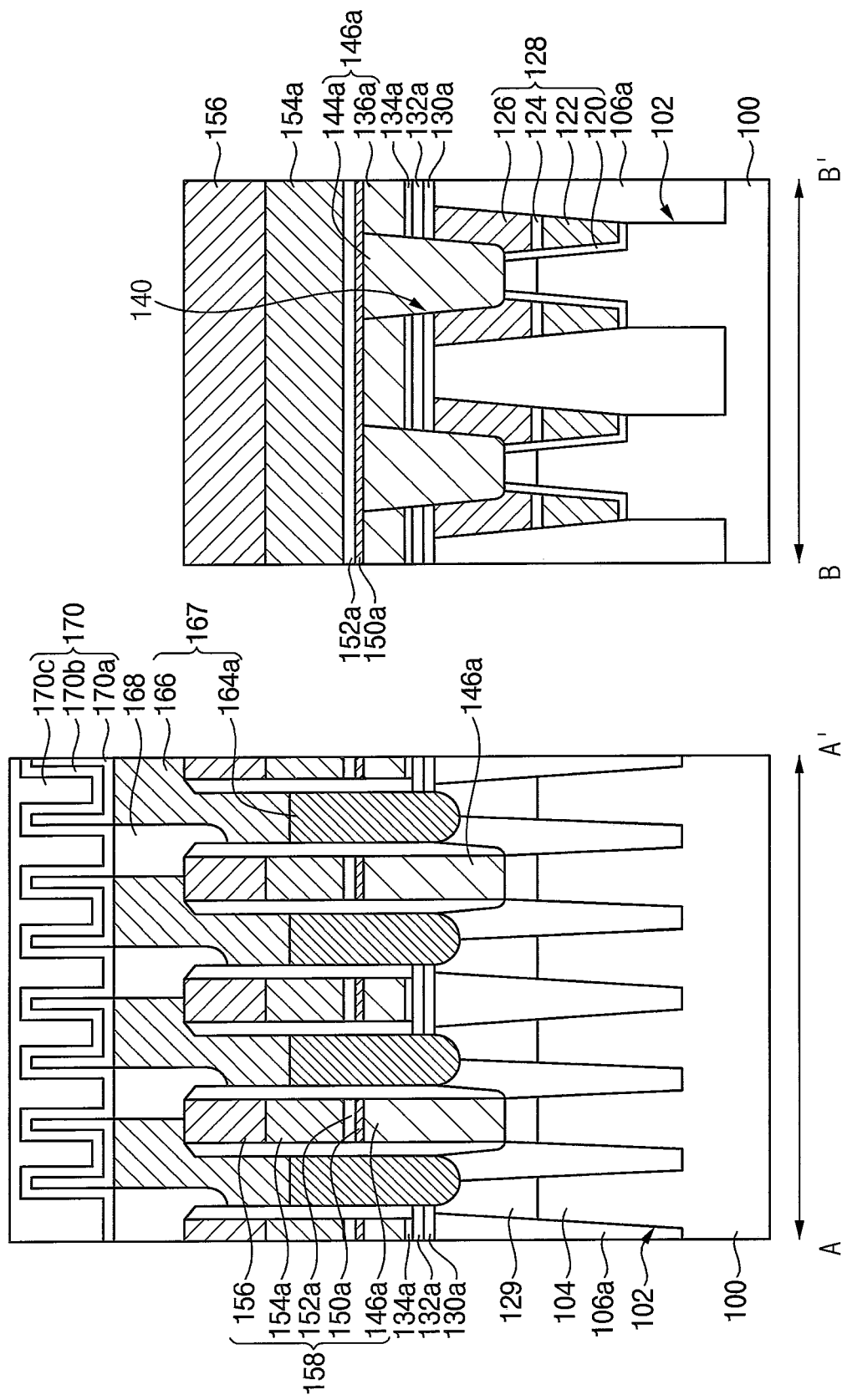

Referring to FIG. 21, an upper portion of the third polysilicon layer 164 may be removed to form the lower contact plug 164a filling a lower portion of the second opening 162. The removing process of the third polysilicon layer 164 may include an etching back process.

A barrier metal layer may be conformally formed on the surface of the bit line structure 158 and the lower contact plug 164a. A second metal layer may be formed on the barrier metal layer. The second metal layer may have an upper surface higher than an upper surface of the bit line structure 158.

A portion of the second metal layer may be etched to form the upper contact plug 166 on the lower contact plug 164a. In the etching process of the second metal layer, a third opening may be formed between the upper contact plugs 166.

An upper insulation pattern 168 may be formed to fill the third opening. The capacitor 170 may be formed on an upper surface of the upper contact plug 166. The capacitor 170 may contact the upper surface of the upper contact plug 166. The capacitor 170 may include a lower electrode 170a, a dielectric layer 170b, and an upper electrode 170c stacked.

By performing the above process, a DRAM device may be manufactured.

Figure 22:
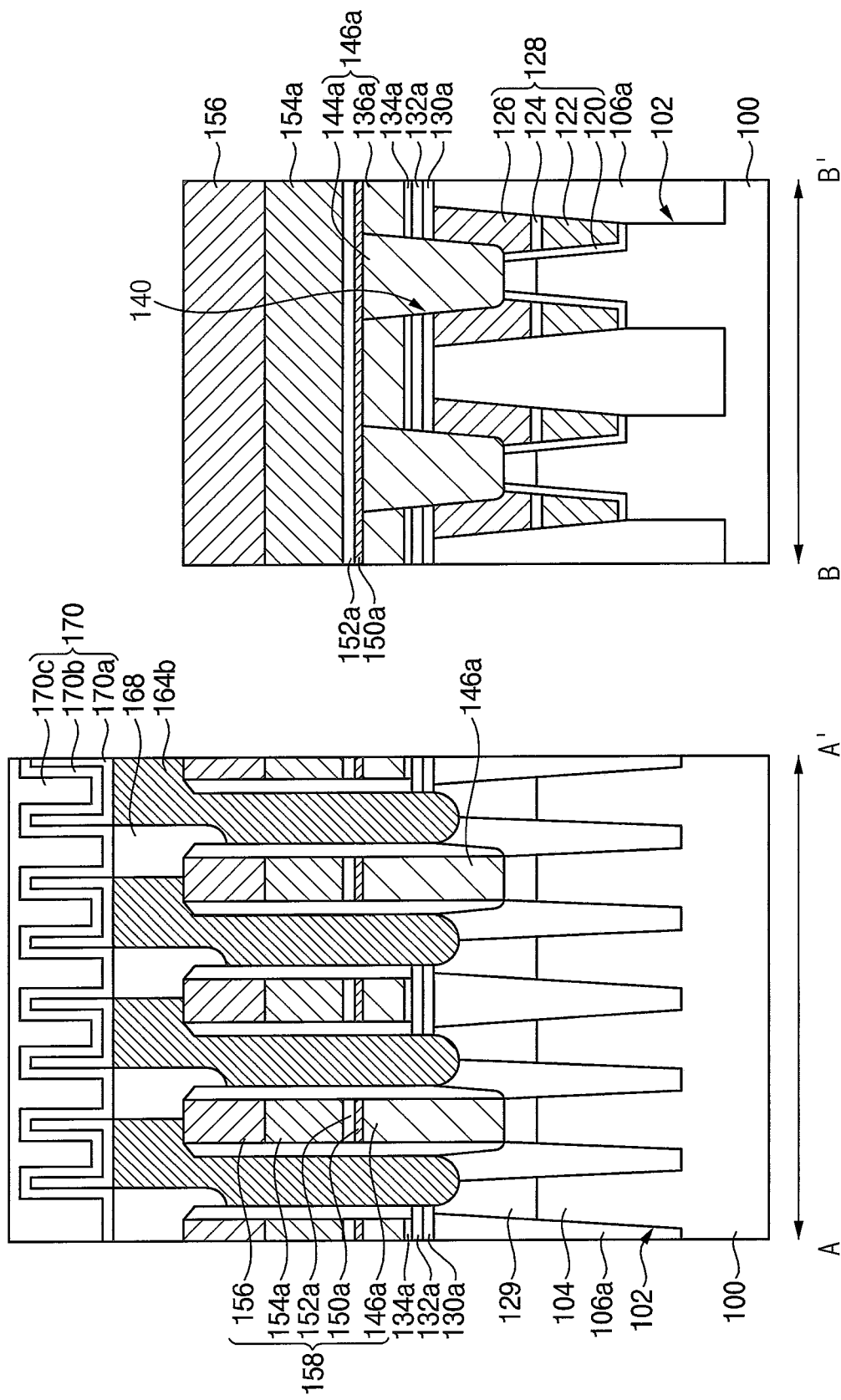
FIG. 22 is a cross-sectional view of a semiconductor device in accordance with example embodiments.

FIG. 22 is a cross-sectional view illustrating a semiconductor device in accordance with example embodiments. The semiconductor device shown in FIG. 22 may be substantially the same as the semiconductor device shown in FIGS. 1 and 2, except for a contact plug electrically connected to the capacitor.

Referring to FIG. 22, a contact plug 164b may contact the active pattern 104 at the lower surface of the second opening 162, and the contact plug 164b may have an upper surface higher than an upper surface of the bit line structure 158. The contact plug 164b may include polysilicon doped with impurities.

The semiconductor device shown in FIG. 22 may be formed by processes similar to those described previously with reference to FIGS. 3 to 21. In detail, the same processes as described previously with reference to FIGS. 3 to 20 may be performed.

Thereafter, a process for forming a lower contact plug by removing an upper portion of the third polysilicon layer may not be performed, and a process for forming an upper contact plug on the lower contact plug may not be performed. Further, an upper portion of the third polysilicon layer may be etched to form the contact plug 164b. In the etching process, the third opening may be formed between the contact plugs 164b.

Thereafter, the upper insulation pattern 168 may be formed to fill the third opening. The capacitor 170 may be formed on an upper surface of the contact plug 164b. The capacitor 170 may contact the upper surface of the contact plug 164b.

As described above, in the semiconductor device, reliability defects that may occur due to voids in the polysilicon pattern included in the bit line structure may be decreased. Thus, the semiconductor device may have high reliability.

By way of summation and review, silicon included in a polysilicon pattern may diffuse from the polysilicon pattern during a thermal process of a high temperature, thereby causing generation of voids in the polysilicon pattern. When voids are generated in the polysilicon pattern, the semiconductor device may have a reliability failure.

In contrast, example embodiments provide a semiconductor device having a high reliability. Example embodiments provide methods of manufacturing a semiconductor device having a high reliability.

That is, in example embodiments of the semiconductor device, the first diffusion barrier layer pattern including polysilicon doped with at least carbon and the second diffusion barrier layer pattern including at least metal may be disposed between the polysilicon structure and the first metal pattern. As the first diffusion barrier layer pattern is formed, the polysilicon structure may not directly contact the second diffusion barrier layer pattern including the metal. Further, the first diffusion barrier layer pattern may prevent silicon included in the polysilicon structure from diffusing into the second diffusion barrier layer pattern and the first metal pattern. Therefore, voids generated in the polysilicon structure due to a diffusion of silicon included in the polysilicon structure into the second diffusion barrier layer pattern and the first metal pattern may be decreased. Defects due to the voids in the polysilicon structure may be decreased, so that the semiconductor device may have high reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including an isolation layer pattern and an active pattern;
a buffer insulation layer pattern on the substrate;
a polysilicon structure on the active pattern and the buffer insulation layer pattern, the polysilicon structure contacting a portion of the active pattern, and the polysilicon structure extending in a direction parallel to an upper surface of the substrate;
a first diffusion barrier layer pattern on an upper surface of the polysilicon structure, the first diffusion barrier layer pattern including polysilicon doped with at least carbon;
a second diffusion barrier layer pattern on the first diffusion barrier layer pattern, the second diffusion barrier layer pattern including at least a metal; and
a first metal pattern and a first capping layer pattern stacked on the second diffusion barrier layer pattern.

2. The semiconductor device as claimed in claim 1, wherein the first diffusion barrier layer pattern has a thickness less than a thickness of the second diffusion barrier layer pattern.

3. The semiconductor device as claimed in claim 1, wherein the second diffusion barrier layer pattern has a thickness of about 10 angstroms to about 50 angstroms.

4. The semiconductor device as claimed in claim 1, wherein the carbon in the first diffusion barrier layer pattern is in a range of about 1 at. % to about 5 at. %, based on a total amount of atoms in the first diffusion barrier layer pattern.

5. The semiconductor device as claimed in claim 1, wherein the first diffusion barrier layer pattern further includes nitrogen.

6. The semiconductor device as claimed in claim 5, wherein the nitrogen in the first diffusion barrier layer pattern is in a range of about 2 at. % to about 10 at. %, based on a total amount of atoms in the first diffusion barrier layer pattern.

7. The semiconductor device as claimed in claim 1, wherein the second diffusion barrier layer pattern includes at least one of silicon-doped titanium nitride, Ti, TiN, TaC, TaCN, TaSiN, TaN, and WN.

8. The semiconductor device as claimed in claim 1, further comprising a contact plug contacting the active pattern, the contact plug including at least polysilicon,
wherein the polysilicon structure, the first diffusion barrier layer pattern, the second diffusion barrier layer pattern, the first metal pattern, and the first capping layer pattern are stacked to define a bit line structure, and
wherein the contact plug is spaced apart from the bit line structure, an upper surface of the contact plug being higher than an upper surface of the bit line structure.

9. A semiconductor device, comprising:
a substrate including an isolation layer pattern and an active pattern;
a gate structure in a gate trench at the isolation layer pattern and the active pattern, the gate structure extending in a first direction parallel to an upper surface of the substrate;
buffer insulation layer patterns on the isolation layer pattern, the active pattern, and the gate structure;
a bit line structure contacting an upper surface of at least one of the buffer insulation layer patterns and an upper surface of the active pattern between the buffer insulation layer patterns, the bit line structure extending in a second direction parallel to the upper surface of the substrate and perpendicular to the first direction;
a contact plug contacting the active pattern and being spaced apart from the bit line structure, the contact plug including at least polysilicon; and
a capacitor contacting an upper surface of the contact plug,
wherein the bit line structure includes:
a polysilicon structure on the active pattern and the buffer insulation layer pattern,
a first diffusion barrier layer pattern on an upper surface of the polysilicon structure, the first diffusion barrier layer pattern including polysilicon doped with at least carbon, and
a second diffusion barrier layer pattern, a first metal pattern, and a first capping layer pattern sequentially stacked on the first diffusion barrier layer pattern.

10. The semiconductor device as claimed in claim 9, wherein the first diffusion barrier layer pattern has a thickness less than a thickness of the second diffusion barrier layer pattern.

11. The semiconductor device as claimed in claim 9, wherein the second diffusion barrier layer pattern has a thickness of about 10 angstroms to about 50 angstroms.

12. The semiconductor device as claimed in claim 9, wherein the carbon in the first diffusion barrier layer pattern is in a range of about 1 at. % to about 5 at. %, based on a total amount of atoms in the first diffusion barrier layer pattern.

13. The semiconductor device as claimed in claim 9, wherein the first diffusion barrier layer pattern further includes nitrogen.

14. The semiconductor device as claimed in claim 13, wherein the nitrogen in the first diffusion barrier layer pattern is in a range of about 2 at. % to about 10 at. %, based on a total amount of atoms in the first diffusion barrier layer pattern.

15. The semiconductor device as claimed in claim 9, wherein the first diffusion barrier layer pattern includes no metal, and the second diffusion barrier layer pattern includes at least metal.

16. The semiconductor device as claimed in claim 9, wherein the polysilicon structure extends in the second direction, and the upper surface of the polysilicon structure is substantially flat.

17. The semiconductor device as claimed in claim 9, wherein the polysilicon structure includes:
 a first polysilicon pattern contacting the upper surface of the active pattern; and
 a second polysilicon pattern on the buffer insulation layer pattern, the second polysilicon pattern contacting an upper sidewall of the first polysilicon pattern.

* * * * *